(12) United States Patent
Yang et al.

(10) Patent No.: US 6,839,452 B1
(45) Date of Patent: Jan. 4, 2005

(54) DYNAMICALLY RE-CONFIGURABLE CMOS IMAGERS FOR AN ACTIVE VISION SYSTEM

(75) Inventors: Guang Yang, West Covina, CA (US); Bedabrata Pain, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 572 days.

(21) Appl. No.: 09/722,249

(22) Filed: Nov. 22, 2000

Related U.S. Application Data
(60) Provisional application No. 60/167,170, filed on Nov. 23, 1999.

(51) Int. Cl.[7] .................................................. G06K 9/00
(52) U.S. Cl. ...................................................... 382/103
(58) Field of Search .......................... 382/103; 348/169, 348/170, 171, 135, 137, 208.14

(56) References Cited

U.S. PATENT DOCUMENTS

| | | | | |
|---|---|---|---|---|
| 5,196,939 A | * | 3/1993 | Elabd et al. ................. 348/314 |
| 5,323,987 A | * | 6/1994 | Pinson ....................... 244/3.16 |
| 5,461,425 A | | 10/1995 | Fowler et al. ............... 348/294 |
| 5,644,386 A | * | 7/1997 | Jenkins et al. .............. 356/4.01 |
| 5,949,483 A | | 9/1999 | Fossum et al. ............. 348/303 |
| 5,961,571 A | * | 10/1999 | Gorr et al. ................... 701/207 |
| 6,166,367 A | * | 12/2000 | Cho ........................... 250/208.1 |
| 6,434,254 B1 | * | 8/2002 | Wixson ....................... 382/103 |
| 6,455,831 B1 | * | 9/2002 | Bandera et al. .......... 250/208.1 |

* cited by examiner

*Primary Examiner*—Andrew W. Johns
*Assistant Examiner*—Shervin Nakhjavan
(74) *Attorney, Agent, or Firm*—Fish & Richardson P.C.

(57) ABSTRACT

A vision system is disclosed. The system includes a pixel array, at least one multi-resolution window operation circuit, and a pixel averaging circuit. The pixel array has an array of pixels configured to receive light signals from an image having at least one tracking target. The multi-resolution window operation circuits are configured to process the image. Each of the multi-resolution window operation circuits processes each tracking target within a particular multi-resolution window. The pixel averaging circuit is configured to sample and average pixels within the particular multi-resolution window.

18 Claims, 27 Drawing Sheets

| Superpixel Size | In2 | In1 | In0 | Out4 | Out3 | Out2 | Out1 | Out0 |
|---|---|---|---|---|---|---|---|---|
| 1x1 | 0 | 0 | 0 | 0 | 0 | 0 | 0 | 0 |
| 2x2 | 0 | 0 | 1 | 0 | 0 | 0 | 0 | 1 |
| 4x4 | 0 | 1 | 0 | 0 | 0 | 0 | 1 | 1 |
| 8x8 | 0 | 1 | 1 | 0 | 0 | 1 | 1 | 1 |
| 16x16 | 1 | 0 | 0 | 0 | 1 | 1 | 1 | 1 |
| 32x32 | 1 | 0 | 1 | 1 | 1 | 1 | 1 | 1 |

Imager Performance Characteristics

| Characteristics | Values |
| --- | --- |
| Imager Format | 256x256 |
| Pixel Pitch | 15 μm x 15 μm |
| Number of Simultaneous ROIs | 3 |
| Max. Update Rate | 100 kHz |
| Super-pixel Sizes | 1x1, 2x2, 4x4, 8x8, 16x16, 32x32 |
| Power Dissipation | < 10 mW |
| Noise | < 7 Electrons |
| Dark Current | 100 pA/cm$^2$ |
| Quantum Efficiency | 22% |

DYNAMICALLY RE-CONFIGURABLE CMOS IMAGERS FOR AN ACTIVE VISION SYSTEM

CROSS REFERENCE TO RELATED APPLICATION

This application claims the benefit of the priority of U.S. Provisional Application No. 60/167,170, filed on Nov. 23, 1999, and entitled Real-Time Reconfigurable CMOS Imager with Variable High-Fidelity Spatial Sampling with Multiple Windows.

ORIGIN OF INVENTION

The invention described herein was made in performance of work under a NASA contract, and is subject to the provision of Public Law 96-517 (35 USC 202) in which the Contractor has elected to retain title.

BACKGROUND

The present disclosure generally relates to an active vision system, and more specifically, to dynamically re-configurable CMOS imagers used in such a system.

Active vision systems are of interest in realizing autonomous systems. These systems range from commercial and industrial applications to surveillance and military applications. The commercial and industrial applications may involve mobile robots, unmanned vehicles including self-navigating cars and search-and rescue vehicles, automatic assembly and product inspection systems. The surveillance and military applications may involve smart weapons and missile defense systems. Active vision systems are also of interest in space applications involving vehicles for space transportation that require autonomous docking and rendezvous with space stations, robotic exploration of planets, and autonomous rovers. However, an active vision system may involve high degree of complexity because it concurrently carries out a number of diverse visual tasks. These visual tasks may include search, detection, recognition, and unresolved multi-target tracking, which may not be easily handled by conventional imaging systems. Search requires wide field-of-view (FOV), tracking requires fast frame rate data output from regions of interest (ROI), recognition requires high spatial resolution, while multi-target cueing requires all three of them concurrently. Furthermore, many active vision applications involve scenes with low contrast, requiring high imaging quality.

For a conventional imaging system, the visual acquisition power is given by:

$$\text{visual } acq. \text{ power} = FOV \times SR \times FR = N^2 * FR,$$

where SR is the spatial resolution, FOV is the field of view, $N^2$ is the number of pixels in the imager, and FR is the frame rate. For a large FOV system having 1 million pixels, operating with an update rate of 1 kHz digitized to 10 bits will require a data output rate at a prohibitively high 10 Gigabits per second. The serial nature of the data output from the imager and the nature of sampling of the scene impose unacceptable limitations on power, speed, and volume of the imaging system. Moreover, data processing complexity grows as O(n), where n is the number of pixels output to the off-chip processor. Therefore, the elimination of data-redundancy is critical for realization of real-time active vision systems.

For such imaging systems, the serial nature of pixel access and the enormity of the data volume impose the greatest bottleneck in coupling an imager to an off-chip processor. Furthermore, most of the power dissipation of an imager is concentrated in the output stage that requires high-speed drive into a large load.

Biological systems, such as a human vision system, achieve real-time imaging through the use of foveated architectures that allow significant data reduction. Foveal vision allows acquisition of images with varying spatial resolution that is coarser at the periphery and more refined at the center (the fovea). However, since the acuity variation is hard-wired, the vision system requires mechanical pointing. Imagers with the pixel sizes scaled and organized in a foveal topology have been demonstrated. Although such imagers do provide some data reduction, pixels may be accessed only in a serial manner. Moreover, the size, power consumption, and the slow response times of mechanical pointing systems preclude an efficient realization of a low-power, miniature, real-time active vision system.

SUMMARY

In one embodiment, the present disclosure describes a vision system. The system includes a pixel array, at least one multi-resolution window operation circuit, and a pixel averaging circuit. The pixel array has an array of pixels configured to receive light signals from an image having at least one tracking target. The multi-resolution window operation circuits are configured to process the image. Each of the multi-resolution window operation circuits processes each tracking target within a particular multi-resolution window. The pixel averaging circuit is configured to sample and average pixels within the particular multi-resolution window.

In another embodiment, the present disclosure discloses a method for searching and tracking targets. The method includes receiving light signals from an image having at least one tracking target, and detecting and separating at least one tracking target into at least one region of interest. The method also includes grouping each of the regions of interest into a plurality of blocks. The method further includes averaging pixels within each of the plurality of blocks.

BRIEF DESCRIPTION OF THE DRAWINGS

Different aspects of the disclosure will be described in reference to the accompanying drawings wherein.

DETAILED DESCRIPTION

Introduction

Figure 1A:
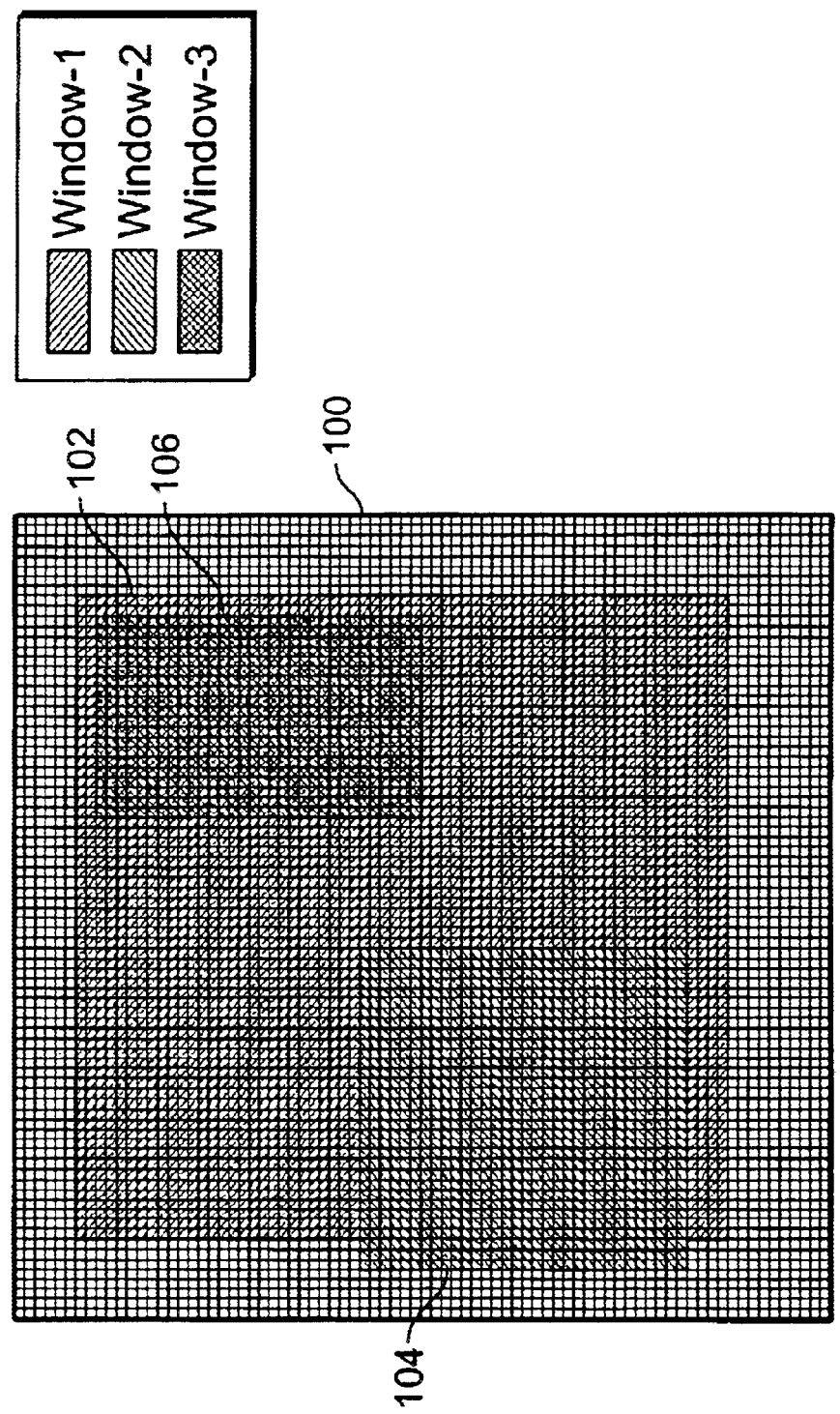
FIG. 1A illustrates an on-demand foveal vision active pixel sensor according to an embodiment of the present disclosure.

The inventors recognized that existing biological vision imagers, such as foveal vision imagers with on-chip foveated structures, suffer from at least three difficulties. First, the multi-resolution lattice is hard-wired, and may not be programmed by the user. Secondly, the high-resolution window is located near the center, effectively restricting the field of view (FOV) and requiring accurate mechanical control of an imager head. Thirdly, the lattice is configured in a log-polar topology that may be sensitive to alignment errors, and may not be compatible with readily available programs.

Therefore, the present disclosure provides methods and systems to substantially reduce the bottleneck presented by the serial nature of pixel access, to reduce power, and to substantially reduce the use of mechanical pointing systems.

To achieve these characteristics, the present system of the active vision chip provides output only from user-selected multiple regions of interest (ROI). The present disclosure also allows on-chip dynamic variation of the ROI resolution, so that the fovea may be placed anywhere within the field-of-view (FOV). This enables the development of a staring system. The vision chip may organize the ROI with minimal overhead time, and integrate on-chip intelligence for self-sequencing the complex imager. Further, the present system provides self-organizing outputs from multiple ROIs, so as to minimize the length of input control vectors.

The inventors determined that the imaging systems based on charge-coupled devices (CCD) may not be able to satisfy all of the above-described requirements. High power dissipation, absence of on-chip timing and control, inability to provide ROI only output, and the absence of on-chip signal processing makes CCDs unattractive for real-time imaging system realization. However, CMOS imagers provide X-Y addressing capability, and allow integration of timing and control circuits as well as of CMOS signal processing circuits on the same chip as the imager. Thus, by appropriate choice of chip architecture and processing circuits, it is possible to realize a low power, and miniature active vision system using CMOS imagers.

The present disclosure describes a high-performance CMOS imager that is capable of imaging at update rates in excess of 1 kHz. The CMOS imager is also capable of providing output from three partially overlapping ROIs, with the locations and resolutions of the ROIs being user programmable. The imager enables a dynamically re-configurable low-power foveal vision system that meets the diverse and conflicting requirement of search, identify and track modes.

Re-Configurable Foveal Vision System

The re-configurable foveal vision system includes an on-demand foveal vision CMOS imager that allows real-time local resolution adaptation for search and track operation. The CMOS imager has multi-resolution windows or super-pixels that are rectilinear in dimension, where the location of the super-pixel and its depth are user programmable. Super-pixel may be generated by averaging signals from a neighborhood of pixels. Pixel averaging is carried out using column-parallel capacitors. In this scheme, only passive circuits are used to provide a low power implementation.

The re-configurable foveal vision system provides ability to position multiple high-resolution tracking windows anywhere in the FOV to significantly enhance tracking accuracy and speed. The system also provides integration of on-chip timing and control logic to allow quick upload of the programming vectors. Further, a high-speed, low-noise super-pixel generation circuit allows the imager to output the multi-resolution data in real-time. The CMOS imager simultaneously provides both high and low-resolution data from the same region by using multiple ports. This enhances the speed of search and track signal processing.

For one embodiment shown in FIG. 1A, the on-demand foveal vision active pixel sensor (APS) 100 has a 256×256 photogate (PG) pixel array with a pixel size of 15 $\mu m^2$. This chip 100 may capture image from three windows 102, 104, 106 in one frame, with each window possessing its unique super-pixel size (NDEPTH) that may be changed from one frame to another.

The re-configurable foveal vision system includes an intelligent imager capable of supporting multi-resolution, multi-ROI imaging at high speed. The system also includes a processor for providing user inputs and data acquisition.

Unlike a prior art foveal vision system, the re-configurable foveal vision system adapts its acuity profile on a frame-by-frame basis to improve update rates. This substantially reduces mechanical gazing. A hybrid detection and tracking approach integrates motion-based and correlation-based techniques. The approach exploits the system's dynamic re-configurability to improve targeting performance.

Figure 1B:
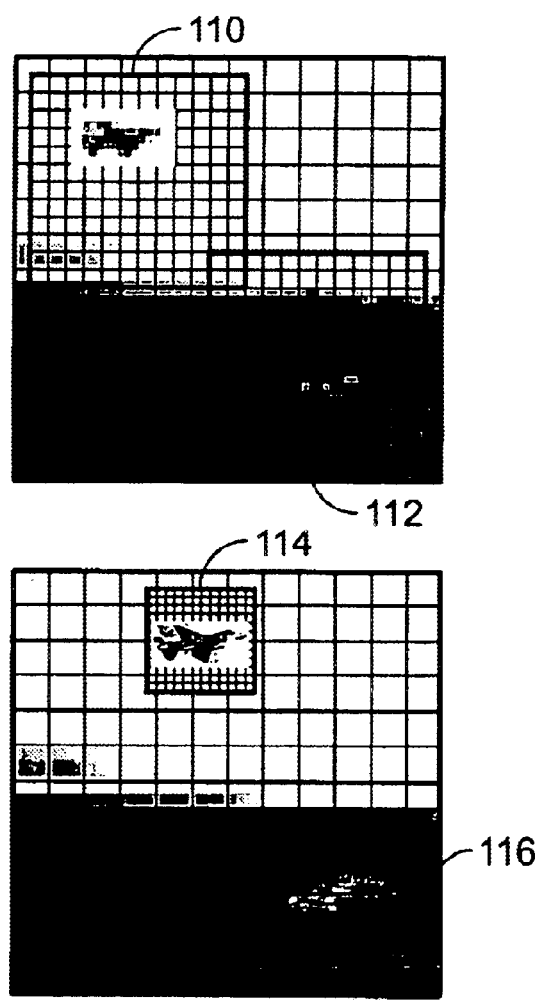
FIG. 1B shows a reconfiguration topology of a foveal vision system.

The reconfiguration of the topology of the foveal vision system is illustrated in FIG. 1B. Targets 110, 112 are initially detected in the system's default wide-FOV, fast frame rate, and coarse acuity configuration. When ROIs are detected. The off-chip processor sends in appropriate control vectors to the imager chip that implements the variable resolution ROI imaging. Spatial resolution is increased only in the vicinity of the detected objects 114, 116 so as to better resolve targets without wasting system resources on irrelevant scene regions. Windows are continuously reconfigured in response to time-varying dynamics including target position, target scale, and tracking gates.

Imager Chip Design and Operation

Figure 2A:
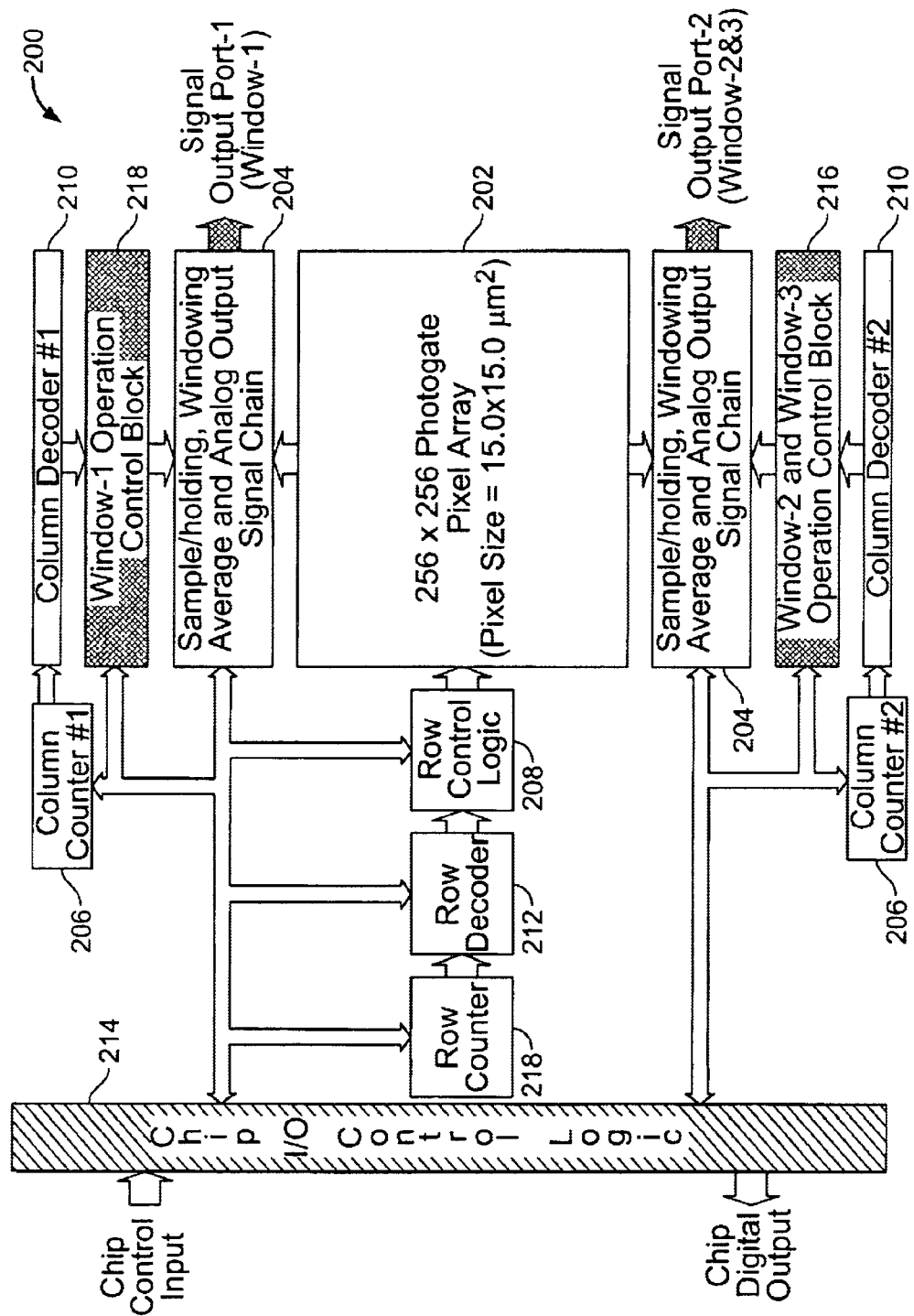
FIG. 2A shows a re-configurable foveal vision APS chip.

A block diagram of the architecture of an embodiment of the re-configurable foveal vision APS chip 200 is illustrated in FIG. 2A as a block diagram. In the illustrated embodiment, the imager 200 includes a 256×256 photogate pixel array 202. The imager also includes averaging and output analog signal chain 204, column counters for column and super-pixel sequencing 206, the row control logic 208, and row 212 and column decoders 210. The imager 200 further includes latches to hold the window definition values, and the chip I/O control logic 214. The imager 200 is capable of supporting three variable resolution windows (ROI) within a given frame. Two of the windows (windows 2 and 3) are controlled by the control blocks 216 located at the bottom of the imager 200 and are output from port #2. Window-1 control 218 and output is located at the top of the imager array. The architecture does not require any modification of the pixel array, since variable ROI resolution is accomplished through column-parallel circuits. This permits multi-resolution output without sacrificing pixel-imaging performance.

Two capacitor banks (three capacitors per column) and their corresponding column logic control circuits are located on the top and bottom sides of the pixel array to perform windowing, super-pixel generation, and data readout. Window-1 will be read out from the output port #1 (located on the top side of the pixel array), window-2 and window-3 will be read out from the output port #2 (located on the bottom side of the pixel array). The column control-logic circuits for controlling and sequencing window-1 operation and windows-2 and -3 operations are different.

A meaningful set of window definitions (location and depth) are supported by the control logic in accordance with an embodiment of the present disclosure. These are summarized below.

Start-Address Location
  WINDOW-1
    Row start address is arbitrary.
    Column start address can only be a multiple number of its super-pixel size.
  WINDOWS-2 and -3
    Both row and column start addresses are arbitrary.
Overlap
  Overlap of window-1 with either window-2 or -3 (in both row and column directions) is allowed.
  Overlap of window-2 and window-3 is allowed only for ROW or for COLUMN, but not both.

Super-pixel Size
  Super-pixel size (NDEPTH) may be only in binary powers. Allowed NDEPTH values are 1, 2, 4, 8, 16, and 32.
  Multiple super-pixels may be clubbed together to form rectangular windows.
  No two windows need to have the same depth.

Imager Pixel

Figure 2B:
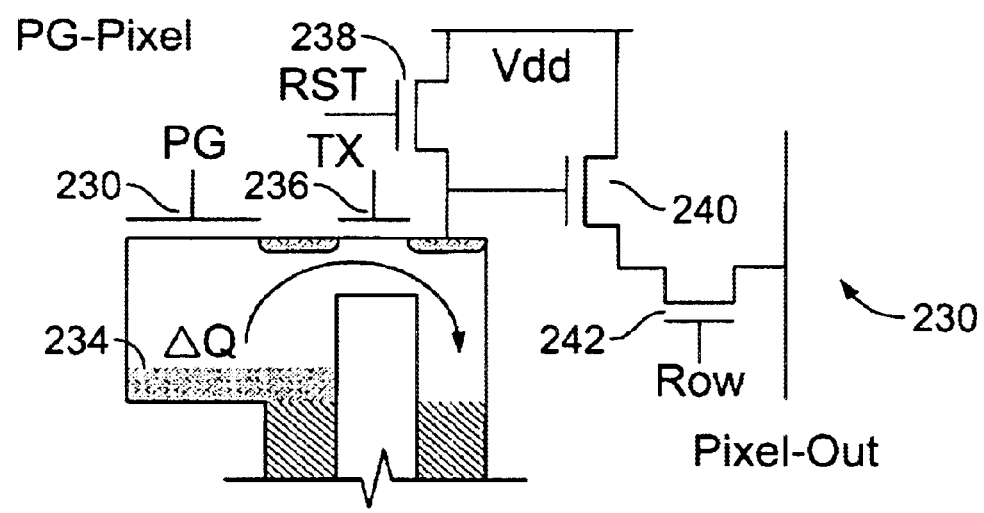
FIG. 2B illustrates a low-noise photogate pixel within the APS chip according to an embodiment.

The imager 200 includes a low-noise photogate pixel 230 as shown in FIG. 2B according to an embodiment. The pixel 230 includes a poly-silicon gate (PG) 232 biased in deep-depletion that is used to collect and accumulate the photo-generated charges 234. The pixel 230 also includes a transfer gate (TX) 236 to dump the charges 234 on the sense-node for readout. Furthermore, the pixel 230 includes reset transistor 238 driven by RST pulse, and the input source-follower 240 and ROW-select transistor 242. The output from the pixel is differentially read over the column bus. The pixel readout incorporates the correlated double-sampling technique in order to cancel reset noise, and provide low-noise output.

The imager 200 operates in a column-parallel fashion. All pixels in a particular row are chosen for readout and initialization. Four clock cycles are needed for pixel readout. The sense node is initially reset by momentarily pulsing RST high. The reset level at the sense node is readout over the column bus, and sampled-and-held on the capacitors at the bottom (or top) of the column. The photoelectrons under the photogate are then dumped on the sense node, by momentarily pulsing PG low. The sense node potential following the charge transfer is finally measured and sampled on another bottom-of-the-column capacitor. The difference in the potentials in column-wise pair of capacitors represents the image intensity for that pixel. The pixels are operated in snapshot mode in order to prevent motion related image distortion.

Chip I/O Control Logic—Chip Control Input

Figure 3:
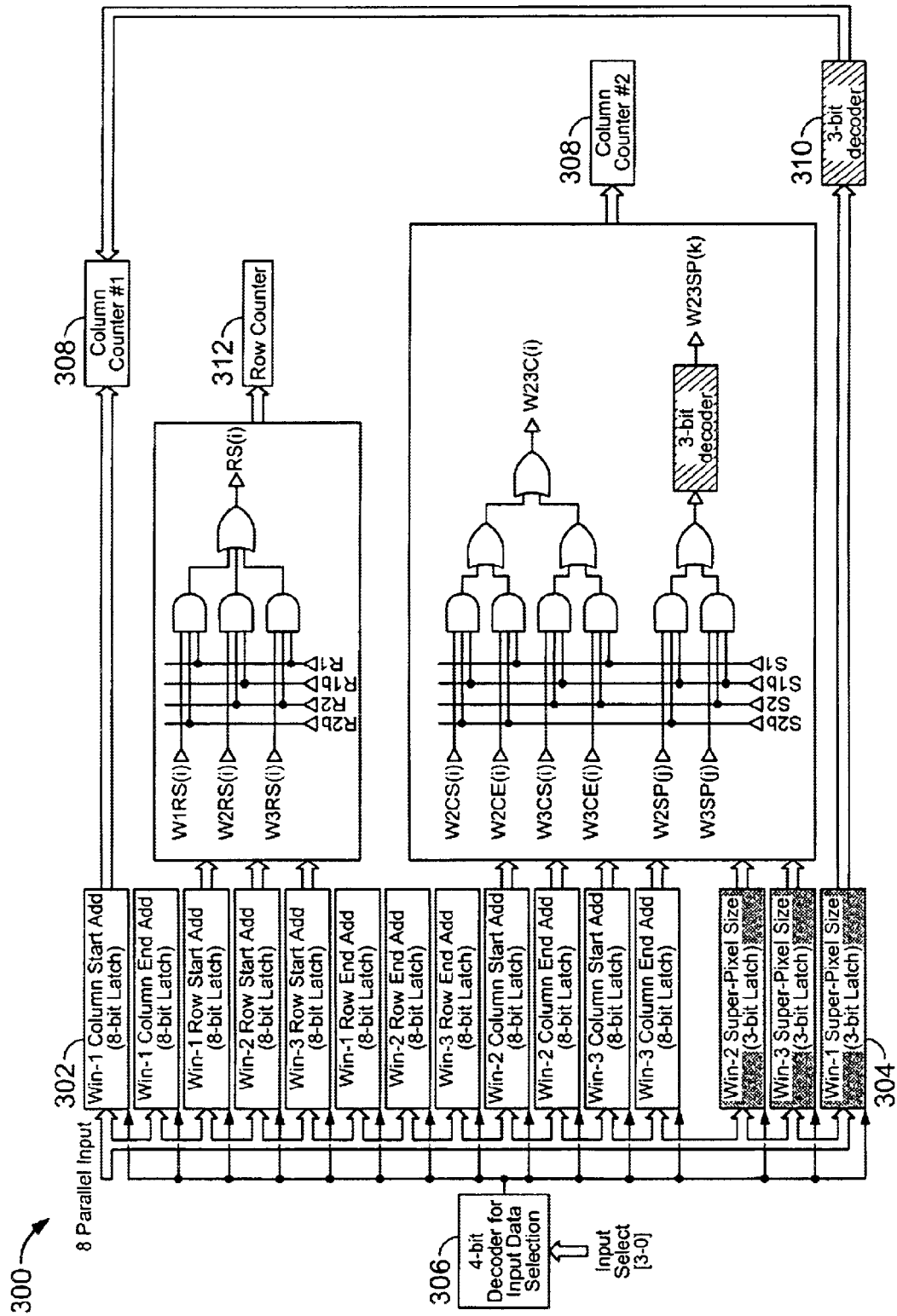
FIG. 3 shows an input store and control block according to an embodiment.

FIG. 3 shows an input store and control block according to an embodiment. The chip control inputs 300 are used for window definition. The inputs 300 define the window start and end addresses 302, and super-pixel sizes for the three windows 304. The inputs also include the necessary control lines 302 to select and latch the window definition information in appropriate latches 302.

Figure 4:
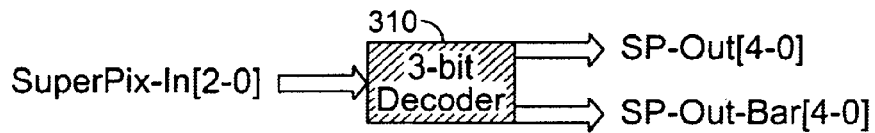
FIG. 4 is a truth table for a 3-bit decoder.

Fifteen sets of parallel-connected latches 302, 304 are used to store the input windowing information. The input bus 300 is eight bits wide. The fifteen sets of latches 302, 304 are addressed by a 4-bit decoder 306 controlled by Input select[3-0]. Column counters #1 and #2 (308) control the column sequencing of window-1, and window-2 and -3, respectively. A 3-bit decoder 310 is used for generation of the proper pattern for signal averaging and signal dump. The truth table for the 3-bit decoder 310 is shown in FIG. 4.

For windowing operation, window-1 column start address is input to column counter #1 (308), which is connected to the column decoder #1. Super-pixel size is also input to column counter #1 (308) through a 3-bit decoder 310. Row start addresses of the three windows are input to the row counter 312 and are selected by R1 and R2 line. Column start and end addresses of window-2 and window-3 are input to column counter #2 (308), which is connected to decoder #2, and are selected by the lines S1 and S2. The lines S1 and S2 are also used to define the super-pixel sizes of window-2 and -3.

Window-1 Operation Control Block

Figure 5:
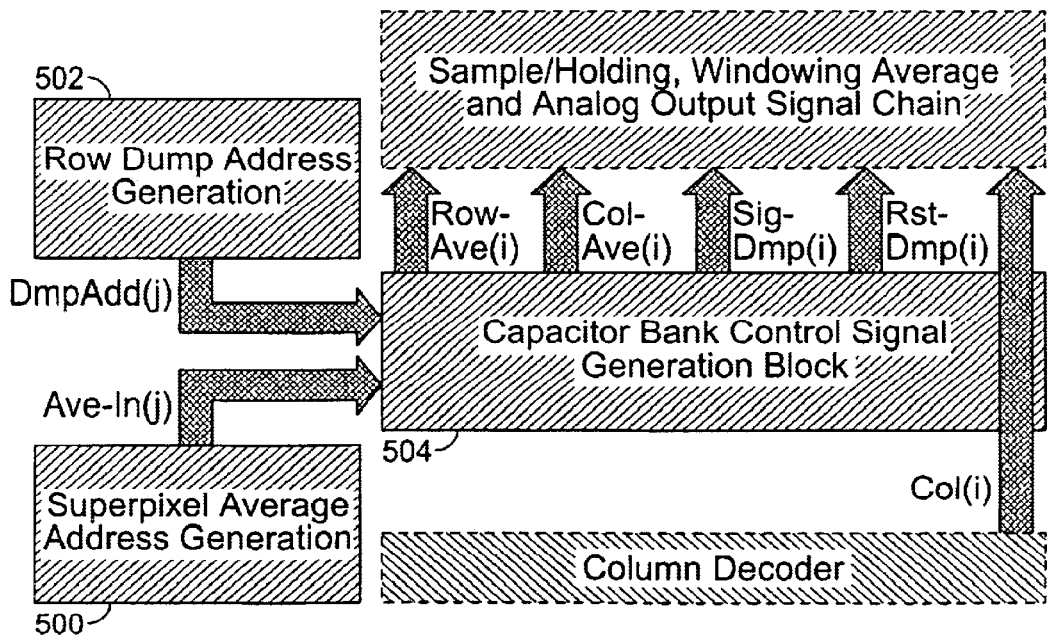
FIG. 5 is a block diagram of window-1 operation control block.

The block diagram of window-1 operation control block is shown in FIG. 5. The control block contains three sub-blocks: super-pixel average address generation 500, row dump address generation 502, and a capacitor bank control signal generation block.

Super-Pixel Average Address Generation Block

Figure 6:
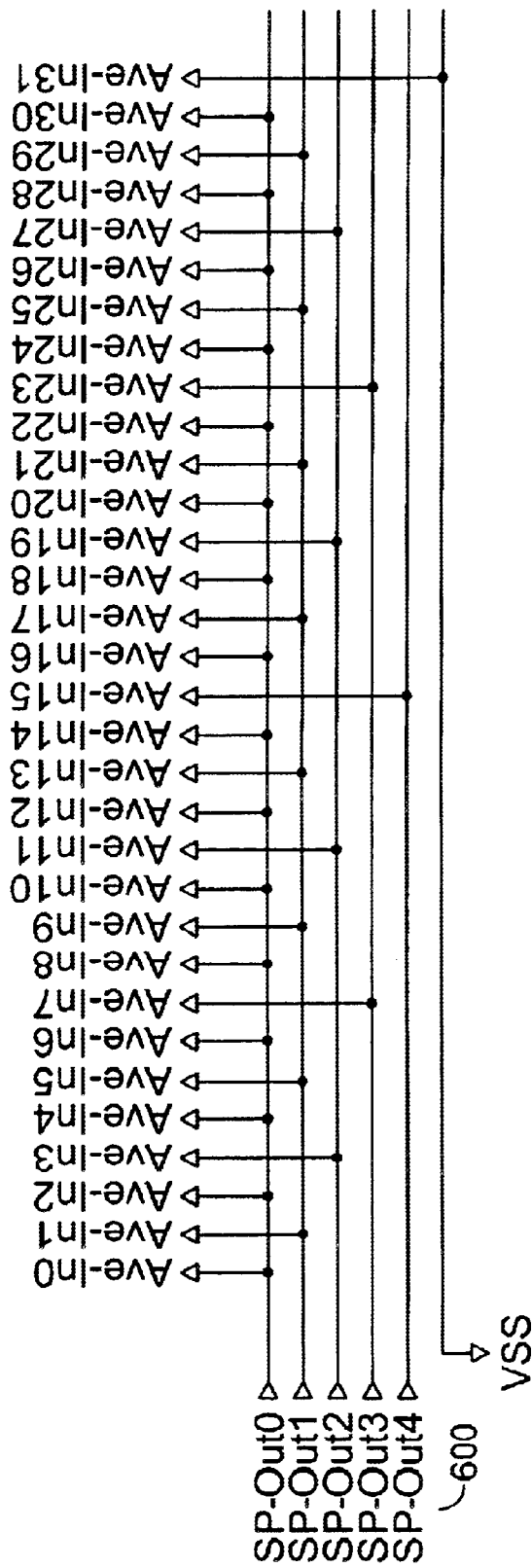
FIG. 6 shows coding of an address pattern by the 3-bit decoder output.

Super-pixel average address bits [Ave-In(i)] control the sequence of switches to be closed for generation of column averages. For example, a pattern [1010 . . . ] defines a 2-column average, whereas a pattern [11101110 . . . ] defines a 4-column average. Since the column start address of window-1 may only be a multiple number of its super-pixel size, the super-pixel average address pattern is fixed once the super-pixel size is defined. This address pattern is coded by the 3-bit decoder output as schematically shown in FIG. 6. The decoder outputs [SP-Out(i)] 600 are connected through wire and logic to generate super-pixel average address bit pattern. Since the maximum super-pixel size is 32, the pattern repeats after 32 columns. Thus, Ave-In(i) is shared by a set of N/32 lines. In general, we have, $$Ave\text{-}In(i)=Ave\text{-}In(32*n+i),$$

where, i=0, 1, . . . , 32; and n=0, 1, 2, . . . , N−1.

Row Dump Address Generation Block

Once the column averages are computed for a particular row, respective average values stored on column capacitors are shared with other in-column capacitors that store the averages for each row. This process is called row-dump. The row dump address selects the particular capacitance with which the column average is shared. Each row dump operation connects successive capacitors from the column-parallel bank to the averaging capacitors. Therefore, the row dump address generation circuit 502 includes a 32-bit serial shift register 700 as shown schematically in FIG. 7.

Figure 7:
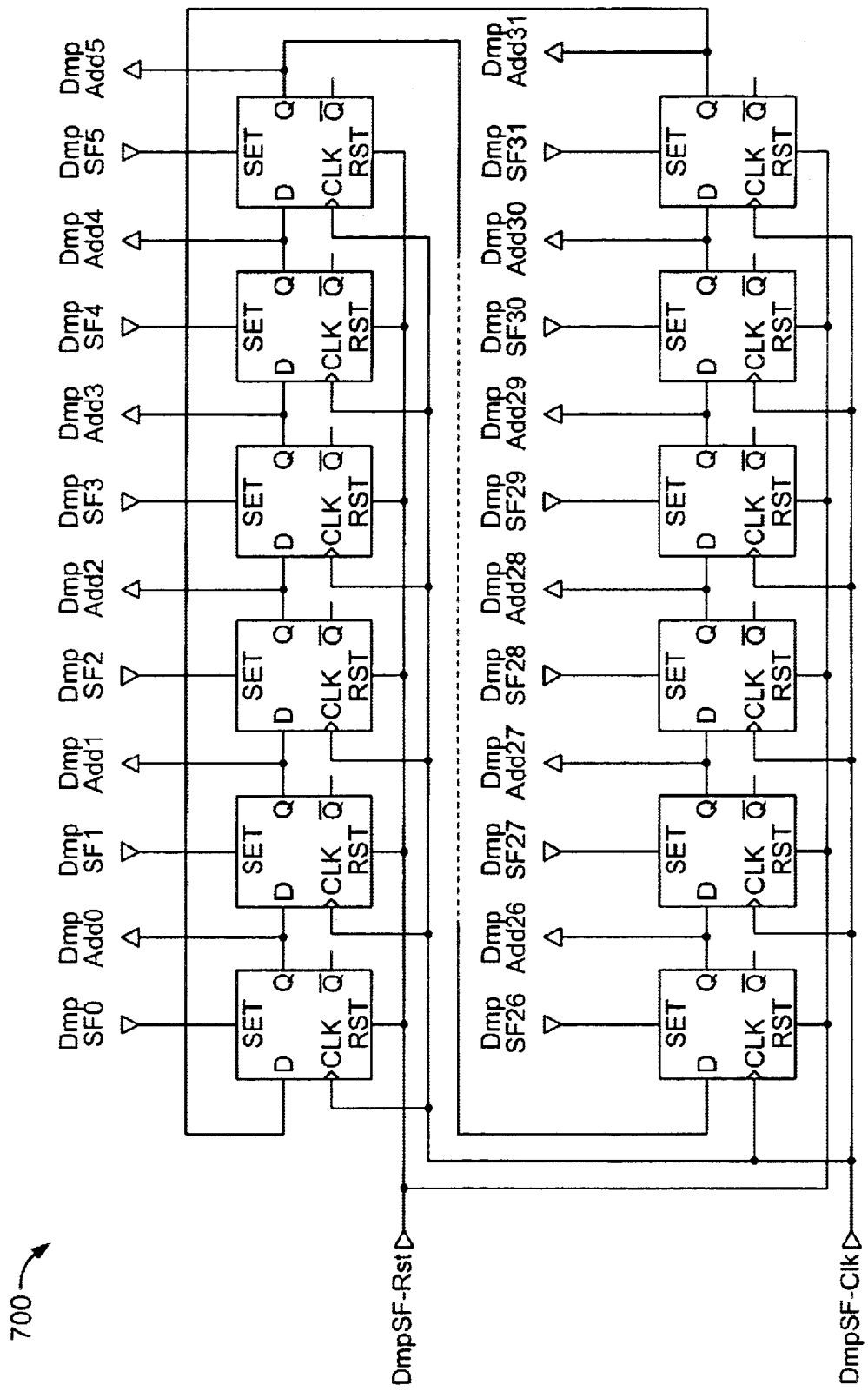
FIG. 7 shows a row dump address generation circuit includes a 32-bit serial shift register.
Figure 8:
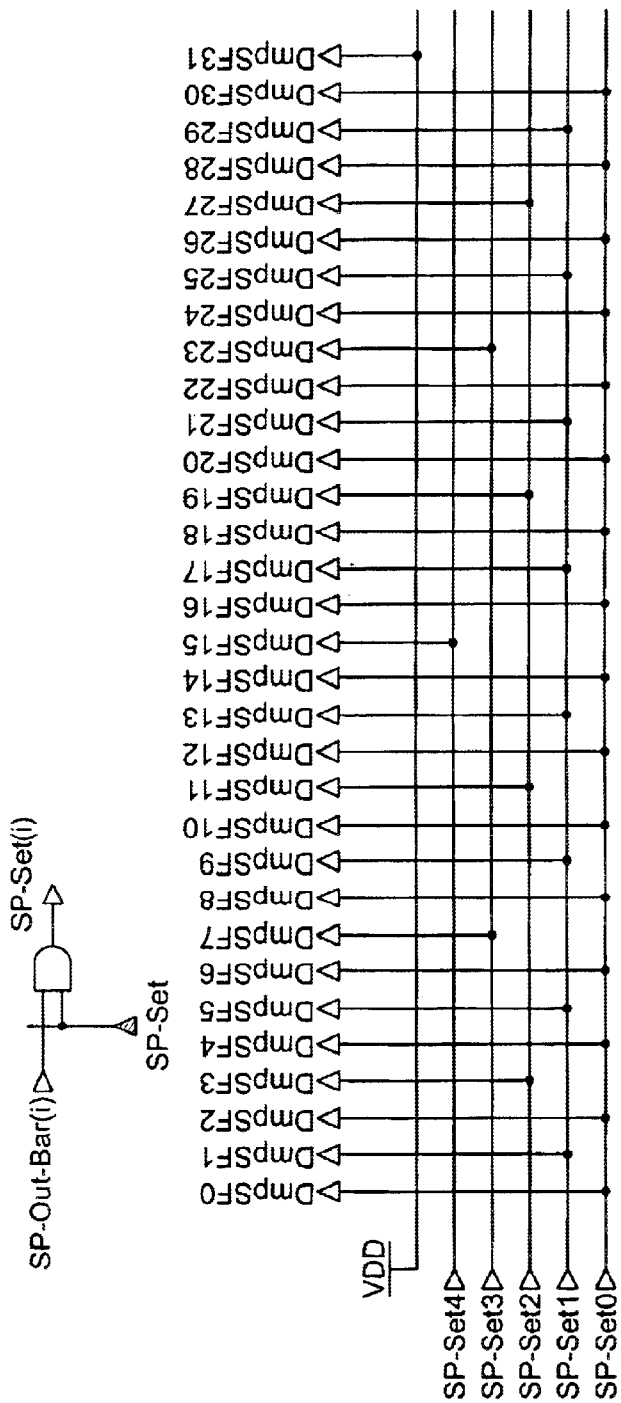
FIG. 8 illustrates generation of a setup address using a wired-logic.

The initial value [DumpSF(i)] of the address generation pattern is determined by the super-pixel size, and may be derived from the 3-bit decoder output [SP-Set(i)]. The setup address pattern is generated using a wired-logic as schematically shown in FIG. 8. For reasons mentioned above, the shift register 700 outputs can be ganged together to serve every $32^{nd}$ column switch. Thus, each output of the shift registers [DmpAdd(i)] 700 in FIG. 7 is shared by a set of N/32 lines.

Capacitor Bank Control Signal Generation Block

Since the imager pixel output includes both reset and signal data, row dump operation needs to be carried out twice: once for rst [Rst-Dmp] and once for the signal [Sig-Dmp]. Two common control pulses [W1Sig-Dmp, and W1Rst-Dmp] are used to determine the actual occurrence of Sig-Dmp and Rst-Dmp control pulses from the DumpAdd outputs.

The other two-capacitor bank control signals for window-1 are Row-Ave 900 and Col-Ave 902. The Row-Ave 900 controls the computation of average of row averages to generate block average. The Col-Ave 902 controls the computation of column averages. Block averaging may be accomplished by carrying out column averages first, followed by average computation along rows. Average-along-column may be generated in parallel, one row-at-a-time. Thus, block averages may be provided by averaging the averages for each row.

Figure 9:
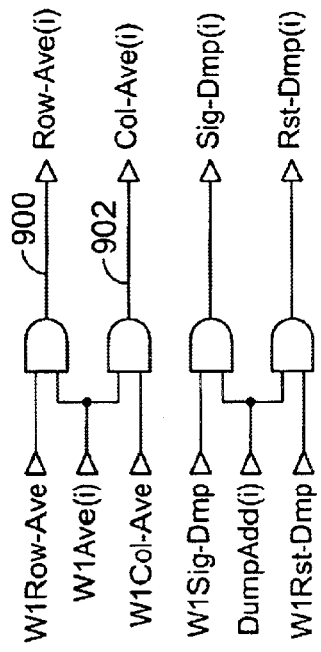
FIG. 9 illustrates generation of Row-Ave and Cal-Ave signals.

Given a particular super-pixel size, the address pattern for both Row-Ave 900 and Col-Ave 902 are substantially similar, except that they are separated in time: Row-Ave 900 pulse occurs once per super-pixel generation, and Cal-Ave 902 pulse occurs for every row. W1 Row-Ave 900 and W1 Col-Ave 902 are two global pulses that are used for generation of Row-Ave 900 and Cal-Ave signals 902 as shown in FIG. 9. W1 Ave(i), like Dump-Add(i), is a column-based input.

Window-2 and Window-3 Operation Control Block

Figure 10:
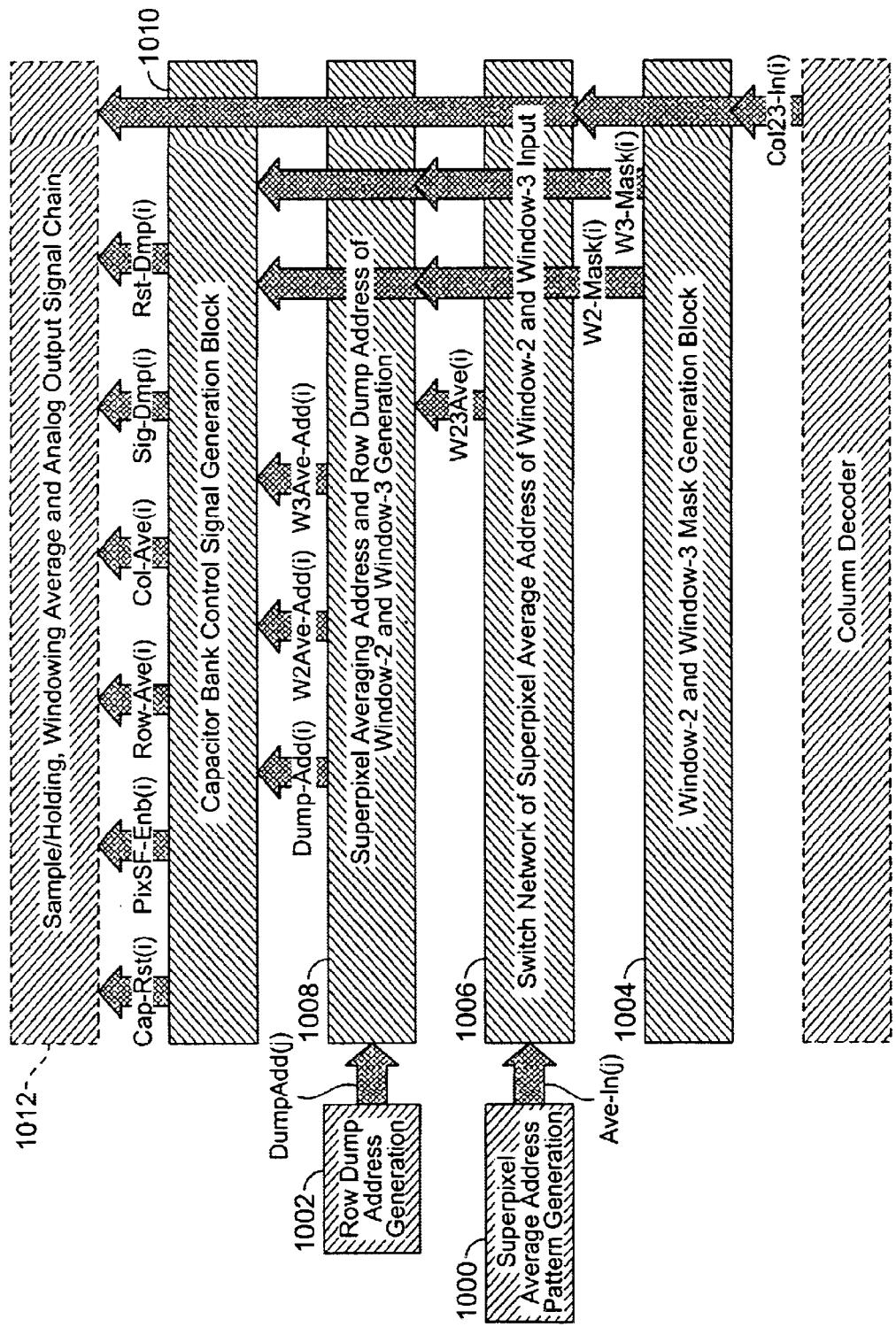
FIG. 10 shows one embodiment of a control block.

The window-2 and -3 control block may be more complicated, since the window start addresses are arbitrary. Therefore the address pattern depends not only on individual super-pixel sizes, but on the column start addresses as well. FIG. 10 shows one embodiment of the control block.

Control Block

The imager is designed to support only selectable ROI resolutions, with the resolutions scaled in a binary fashion from 1×1 to 32×32. Thus, there are six different super-pixel resolution settings, although multiple adjoining super-pixels may be grouped together to create arbitrarily large ROIs. The control blocks are used to generate the appropriate switching pattern given the locations and super-pixel sizes of the three ROIs or windows. The window-1 may overlap with window-2 and window-3.

The complexity of the control block arises from the fact that the row addresses of the window-2 and window-3 may overlap, the column start addresses of either window may be an arbitrary number (i.e. not a multiple of super-pixel size), and the super-pixel sizes may be different. Thus, the bit pattern for the column-based control pulses depends not only on individual super-pixel sizes, but on the column start addresses as well. Moreover, the capacitors involved in generating the block averages need to be reset or shared at different instants depending upon individual super-pixel sizes. The bit pattern for Row-Ave(i), Block-Ave(i), Rst-Dmp(i), Sig-Dmp(i), and Cap-Rst(i) are generated separately for each window/ROI, and are combined to form the integrated bit pattern for controlling both ROIs simultaneously.

The illustrated embodiment of FIG. 10 show six sub-blocks: super-pixel average address pattern generation 1000, row dump address generation 1002, window-2 and window-3 mask generation 1004, switch network of inputting super-pixel averaging address of window-2 and window-3 (1006), super-pixel average address and row dump address of window-2 and window-3 generation 1008, and capacitor bank control signal generation block 1010.

Since the address patterns for the row averaging and row dumping for the two windows are different, two: masking patterns need to be generated in order to separately load and latch the column control bit patterns. The masking pattern for each window is generated from the ROI column start and end address using an EXOR-based logic. Since each column communicates to its neighboring column, the masking pattern generation proceeds in a ripple fashion. The setup time for generating the masking pattern is then given by:

$$t_{setup}=3*M*t_{gate},$$

where M is the number of columns in the ROI, and $t_{gate}$ is a single gate delay. The maximum set-up time for both windows may be determined by setting M equal to the imager format. For a 512×512 imager, $t_{setup}$(max.) is only 5 μsec.

Super-pixel averaging address bits [Ave-In(i)] control the pattern of switches to be closed for generation of the row-averages. For instance, a pattern [1010 . . . ] defines a 2-pixel average, whereas a pattern [11101110 . . . ] defines a 4-pixel average. Since there are 6 possible patterns (corresponding to 6 ROI resolutions), a 3-bit decoder is used to generate the required pattern. The decoder outputs are connected through a wired-logic to generate the address bit pattern. Since the maximum super-pixel size is 32, the pattern repeats after 32 columns. Thus, Ave-In(i) is shared by a set of N/32 lines. In general, Ave-In(i)=Ave-In(32*n+i), with i=0, 1, . . . , 32; and n=0, 1, 2, . . . , N−1.

Super-Pixel Average Address Pattern Generation Block

The super-pixel average address pattern generation block 1000 for window-2 and -3 is essentially the same as the corresponding super-pixel average address generation block 500 described in Window-1 Operation Control Block section. Since there are two windows, S1 and S2 are used to independently select the address for the two windows.

Row Dump Address Generation Block

Similar to the row dump address generation block 502 of window-1, this block 1002 for window-2 and -3 includes two individual 32-bit serial shift registers. Their initial values defined by the super-pixel DEPTHS of window-2 and -3. The shift register initialization process is the same as described in Chip I/O Control Logic section.

Window-2 and Window-3 Mask Generation

Since the address patterns for super-pixel average generation and row dump address generation for the two windows are different, two masking patterns need to be generated. These mask patterns may determine the regions where the address patterns mentioned above will be loaded.

Figure 11:
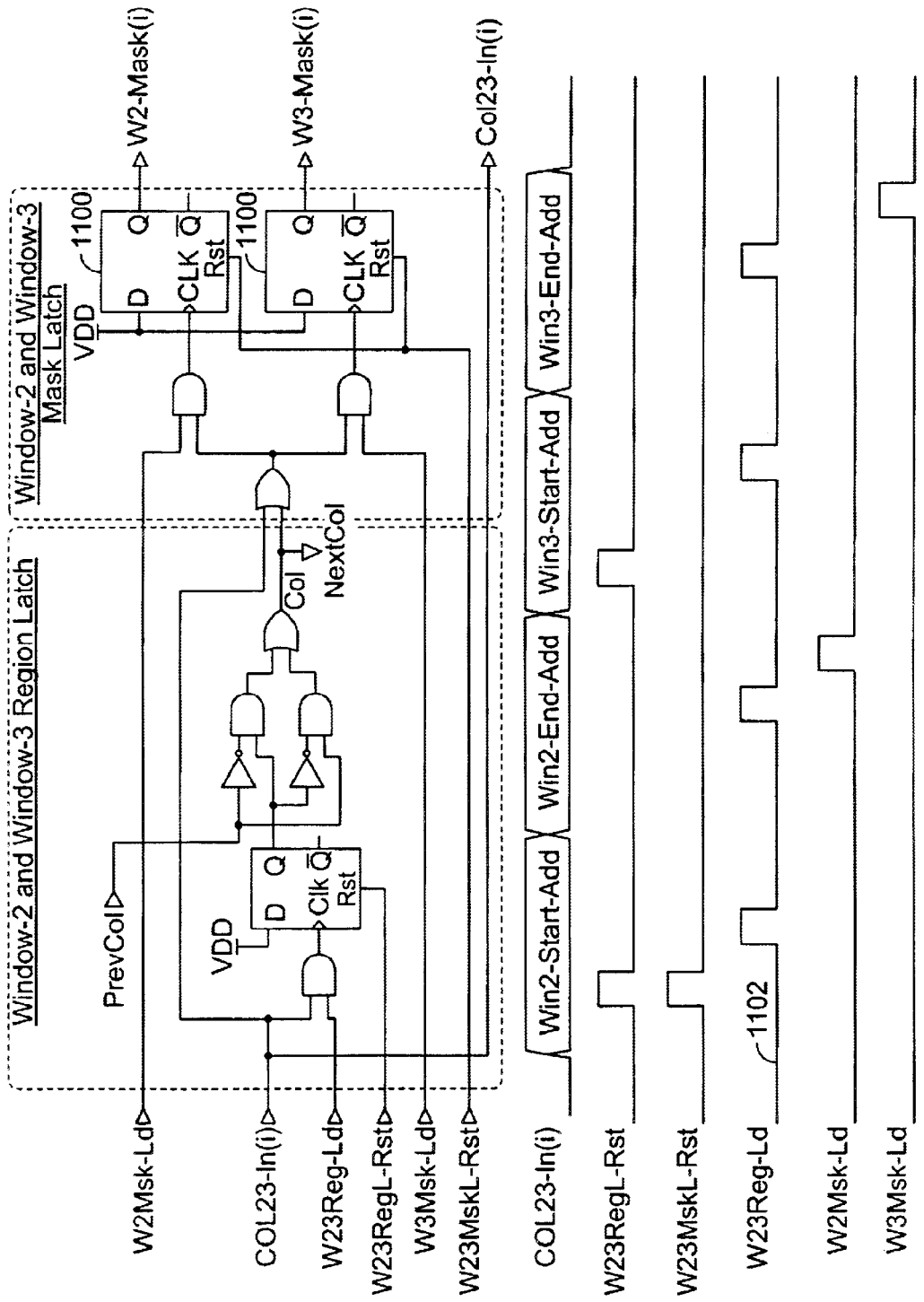
FIG. 11 shows one embodiment of a column circuit schematic and control waveform for a mask generation block.

FIG. 11 shows one embodiment of the column circuit schematic and control waveform for the mask generation block 1004. Mask for each window is defined as logic 1 for start address through end address, and logic 0 elsewhere. The appropriate mask pattern is then stored in the column-parallel latches 1100, one latch per window (or two per column).

Both start and end addresses are used to generate the mask pattern using a latch and combinatorial logic as shown in FIG. 11. The region flip-flops in the columns selected by the start and the end addresses are latched high by sequentially applying the start and the end addresses to the column counter #2, and pulsing W23Reg-Ld 1102, as shown in the timing diagram. Once the latches are loaded, bit pattern loaded in the columns are: [0000 . . . 0001000 . . . 0000100000]. The logic 1's signify the locations of the start and the end columns for the given window. Since each COL output is connected to the next column, the EXOR-based logic circuit transforms the pattern [0000 . . . 0001000 . . . 0000100000] to [0000 . . . 0001111 . . . 1111000000]. This generates the masking pattern. Since each column communicates to its neighboring column, masking pattern generation proceeds in a ripple fashion. The setup time for generating the masking pattern is then given by:

$$t_{setup} = 3 * M * t_{gate},$$

where M is the number of columns the window has, and $t_{gate}$ is a single gate delay. The maximum set-up time for both windows may be determined by setting M equal to the imager format. For a 512×512 imager, $t_{setup}$ (max.) is only about 5 μsec.

The masking pattern for a given window is latched into one of the two latches using either W3Msk-Ld or W2Msk-Ld.

Figure 12:
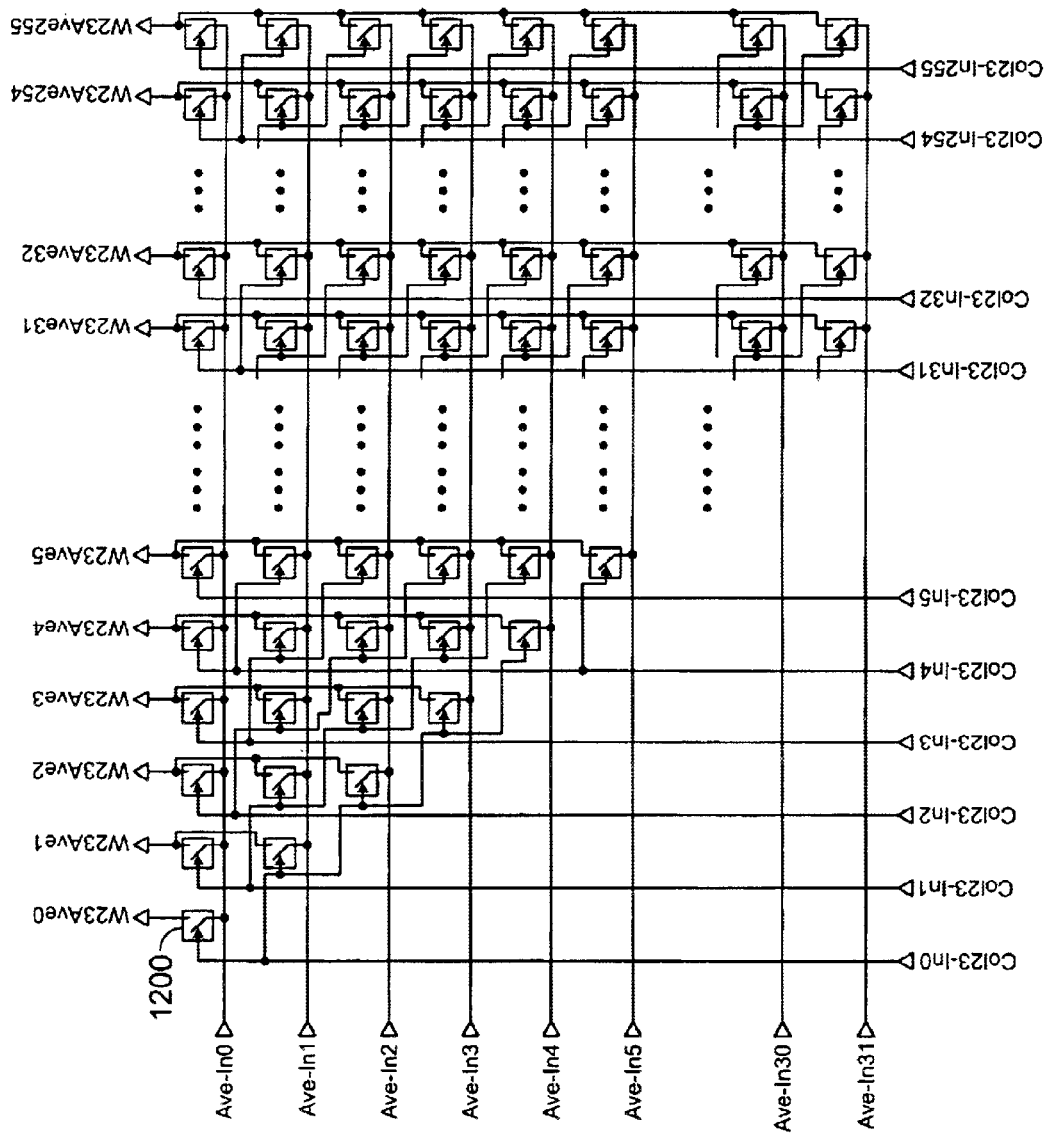
FIG. 12 shows a diagonal switch array according to an embodiment.

Since the ROI column starting address may be arbitrary, Ave-In(i) bits or the bit pattern need to be appropriately shifted and aligned to the actual ROI starting address. An efficient realization of the shift-and-align operation is is through the use of a diagonal switch array as shown in FIG. 12.

The switch array includes 32×n switches 1200, where n is the total number of imager columns, and is controlled by the ROI column start address. The diagonal control connection ensures that the averaging bit pattern is applied column-wise. The bit pattern beginning may be determined by the ROI column start address. The shifted bit pattern is then AND'ed with the corresponding masking pattern for the ROI in order to generate the column-based control signals that control the row and block averaging.

A considerable reduction in hardware is achieved by eliminating the use of a switch network for row dump address bit pattern generation. For dumping the row-averages into the holding capacitors [Csig and Crst in FIG. 16], it may not be necessary for the dump switches [Rst-Dump(i) and Sig-Dmp(i)] to be closed in any fixed sequence. As long as every row dump operation accesses a different set of column capacitors within the ROI, super-pixel value may be generated correctly. The row dump control pulses are generated in a manner similar to the averaging control pulses using a 3-bit decoder and wired logic. Unlike averaging control pulses that remain fixed, the row dump pulses are shifted with every row. Hence, the row dump pulses are generated from a shift register. The actual control signals may be generated by AND'ing the averaging and dumping bit patterns with the row-decoded control signals. This allows proper phasing of the averaging, resetting and dumping control pulses.

Figure 13:
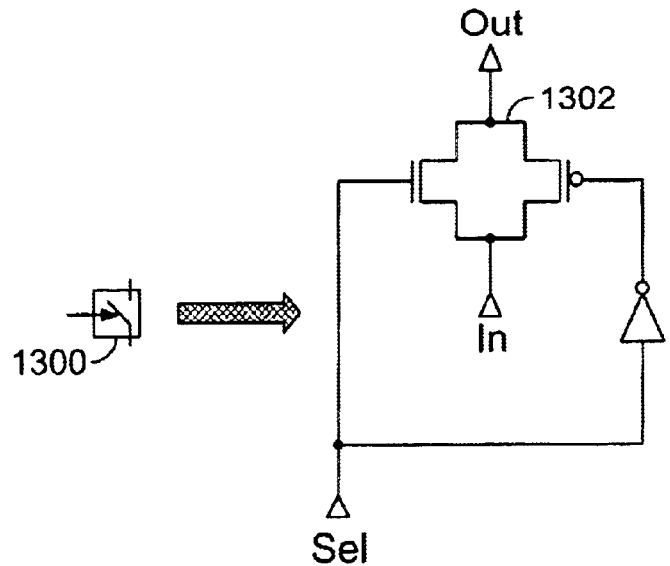
FIG. 13 shows a diagonal switch bar.

Switch Network of Inputting Super-Pixel Average Address of Window-2 and Window-3 Block Since the column start address of window-2 and window-3 may be anywhere in the pixel array, the super-pixel averaging pattern of window-2 and window-3 (generated by super-pixel average address pattern generation block 1006) may be remapped to align them with the respective column start addresses. This may be accomplished using a diagonal switch bar 1300 as shown in FIG. 13. Each column decoder address [Col23-In(i)] is able to select the Ave-In(i) lines substantially simultaneously to generate the appropriate average pattern [W23Ave(i)]. As it is for window-1, every other 32 average output lines are connected together. Thus, Ave(i) is shared by a set of N/32 lines to generate a repetitive pattern that is 32 bits long.

Each switch is implemented as a CMOS transmission gate 1302 shown in FIG. 13. The entire network contains (32× N−528) switches 1300. In order to generate the shifted averaging address pattern for a particular window, the corresponding start address is pulsed again to select the appropriate column.

Figure 14:
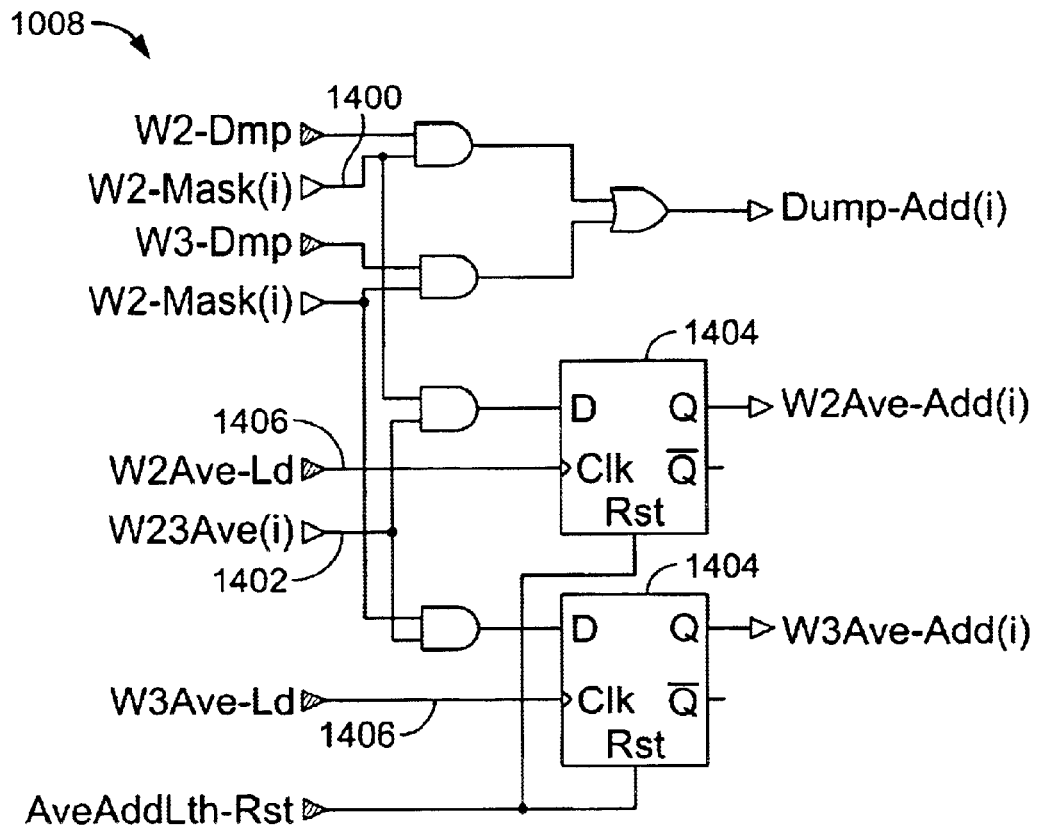
FIG. 14 shows one embodiment of a super-pixel averaging address and row dump address generation block.

Super-Pixel Average Address and Row Dump Address of Window-2 and -3 Generation Block Once the shifted average address pattern is generated, it needs to be masked by the appropriate window mask. This allows the pattern to not spill over outside the window region. FIG. 14 shows one embodiment of the super-pixel averaging address and row dump address generation block 1008. The averaging address pattern is generated by AND'ing the Mask pattern [e.g. W2-Mask(i)] 1400 with the corresponding switch network output [W23Ave(i)] 1402. The pattern is then loaded into the appropriate latch 1404 by pulsing the appropriate Ave-Ld pulse 1406. For example, W2Ave-Ld generates W2Ave-Add(i).

The advantage of the present disclosure includes the fact that generation of the row dump address requires no switch network. For dumping the row averages into row average hold capacitors [Csig and Crst in FIG. 16], the dump switches do not necessarily have to be closed in any fixed sequence. As long as every row dump operation accesses a different set of column capacitors within the window of interest, super-pixel value may be generated correctly. This allows considerable reduction in hardware. Therefore, the dump address [Dump-Add(i)] may be generated by appropriately selecting the masking pattern with W2-Dmp and W3-Dmp selection pulses.

Capacitor Bank Control Signal Generation Block

In order to control the analog signal chain and the capacitor averaging circuits, additional control lines are needed. These lines may be derived from the existing average address [W2Ave-Add(i) and W3Ave-Add(i)], dump address [Dump-Add(i)], and mask address [W2-Mask(i) and W3-Mask(i)] lines. The average address lines for each window may be used twice: once for row average [Col-Ave (i)] computation (along column direction), and then for block average [Row-Ave(i)] computation (for all rows). Two global signals [W2 Row-Ave and W3 Row-Ave] are used for this purpose.

Figure 15:
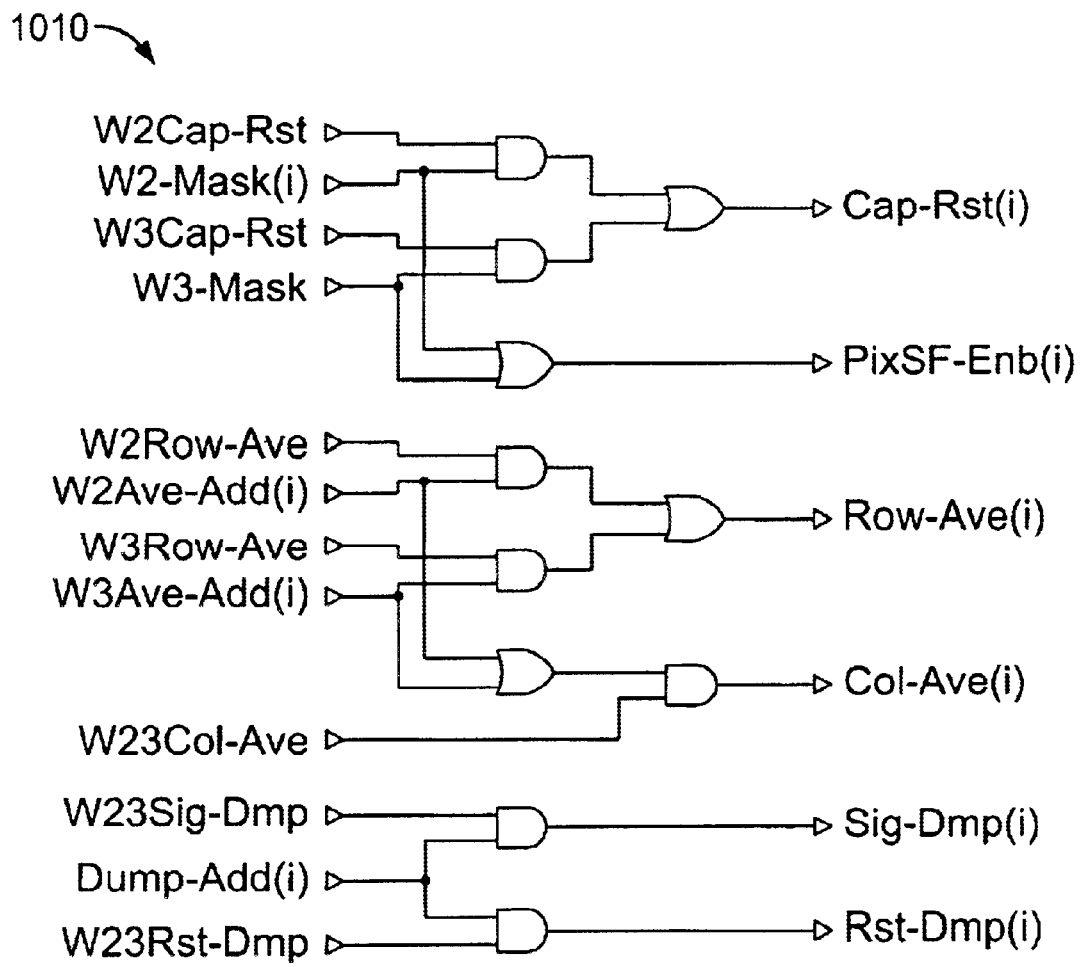
FIG. 15 illustrates one embodiment of a capacitor bank control signal generation block.

FIG. 15 illustrates one embodiment of the capacitor bank control signal generation block 1010. In the illustrated embodiment, dump address pattern may also be used twice: once to dump the reset values and then to dump the signal values. These are generated from Dump-Add(i) as shown in FIG. 15. The mask pattern is used for generation of capacitor reset pulse [Cap-Rst(i)] that is needed for resetting the row average hold capacitors [Csig and Crst in FIG. 16] at the end of super-pixel computation cycle.

The mask addresses are also used to generate the pixel source follower enable signal [PixSF-Enb(i)]. Unlike conventional imaging applications, the foveal vision imager operates on two relatively small windows. Since the imager is read out in column-parallel fashion, PixSF-Enb(i) signal is used to disable source followers that are connected to pixels that lie outside the window of interest. This allows significant power savings.

Sample/Holding, Windowing Average and Analog Output Signal Chain

Figure 16:
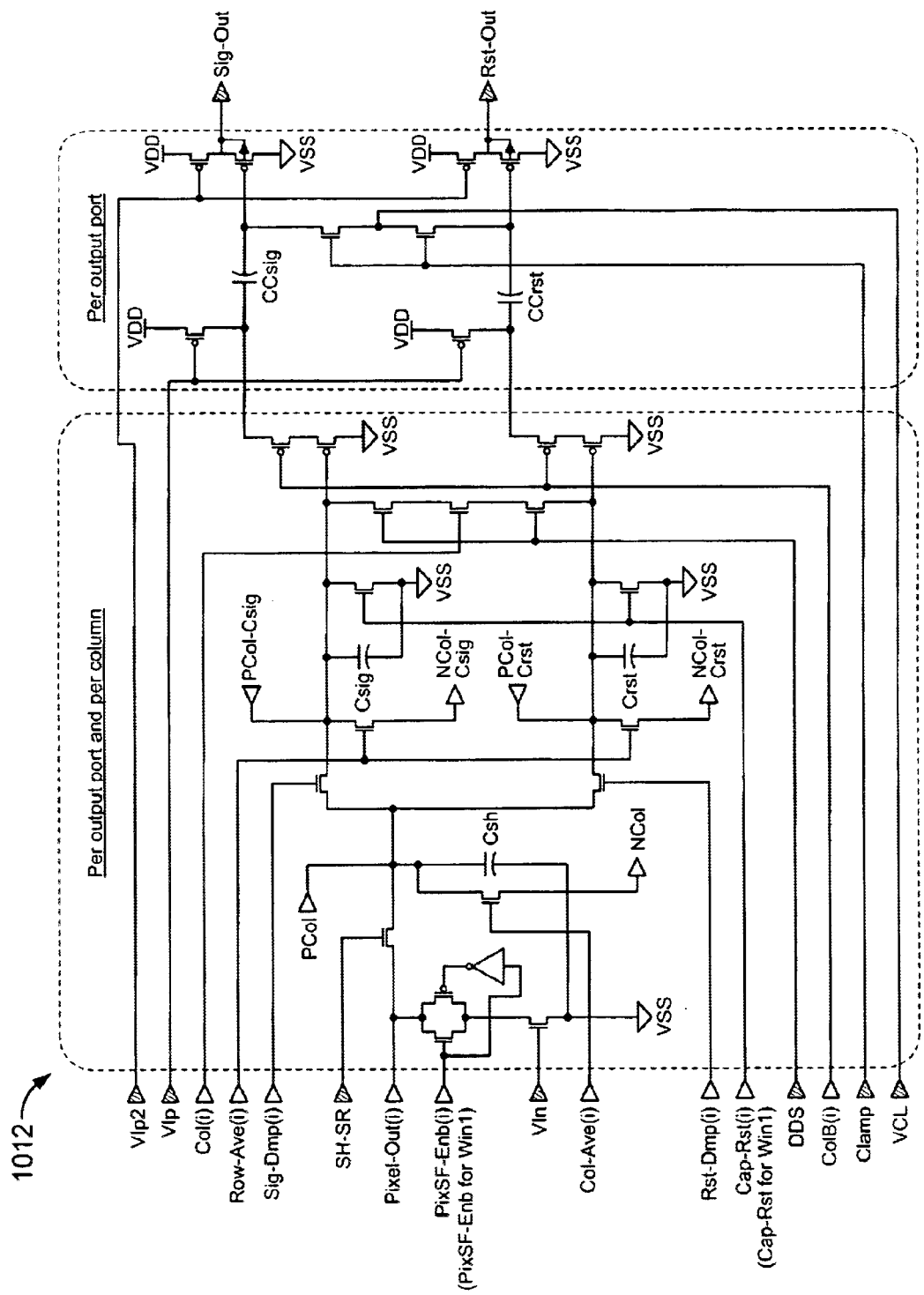
FIG. 16 shows one embodiment of sample/holding, windowing average and analog output signal chain.

One embodiment of sample/holding, windowing average and analog output signal chain 1012 is shown in FIG. 16. The illustrated embodiment shows how the column-control signals control the sample-and-hold operation and block average computation. The analog signal chain is substantially the same as presented elsewhere. The analog circuit is substantially the same for Signal Output Port #1 and #2. The only difference between analog circuit of window-1 and analog circuit for window-2 and window-3 is that the control signals PixSF-Enb and Cap-Rst are global for the window-1, while they are column-based for the window-2 and window-3.

Variable-Resolution ROI Generation Circuits

Variable resolution ROI is implemented by averaging a block of n×n neighboring pixels to generate a super-pixel. A super-pixel represents a spatially low-pass-filtered version of the actual scene. Variable resolution may also be implemented by sub-sampling the array, which simplifies processing. However, variable resolution may have to be implemented only at an unacceptable cost of image aliasing. Image aliasing leads to both false-positive and false-negative object identification.

Averaging is carried out in a passive capacitor array organized in column-parallel fashion. In the illustrated embodiment of FIG. 16, the block average is computed in two steps. First, the average of a given row of pixel values (row-averages) are computed during the row sampling phase, and stored on a set of column capacitors (Csig and Crst). Once the computation of individual row-averages within the super-pixel is over, average of the row averages are computed to generate the block-average or the super-pixel value.

The averaging circuitry operates as follows. The sample-and-hold capacitor (Csh) in each column is connected to its nearest neighbors by means of a switch controlled by column-generated Row-Ave(i). A particular Row-Ave(i) bit pattern causes a set of neighboring Csh capacitors to be connected, averaging the values stored on the capacitors. Since the pixel is read out differentially, row-average is generated separately for the pixel reset values and the pixel signal values. The computed row-average for the reset values is stored on a holding capacitor, Crst, belonging to the i-th column by pulsing the corresponding row-dump pulse, e.g. Rst-Dmp(i). Similarly, the row-average for the pixel signal values is stored on the corresponding Csig.

Thus, row-averages from successive rows are stored in separate column holding capacitors. This is accomplished by using row dump pulses belonging to successive columns. Thus, row-averages for rows m to m+k, where k is the super-pixel size, and m is the starting row address, are stored on column holding capacitors belonging to columns j to j+k, where j is the starting column address. The super-pixel values for the reset and signal levels are separately generated by averaging the potentials on the column holding capacitors (Csig and Crst respectively) belonging to that super-pixel.

The column-generated control pulse for this purpose is Block-Ave(i). For a given super-pixel size, the bit pattern for Row-Ave(i) and Block-Ave(i) are substantially similar. The bit pattern does not vary from one row to another, except that they occur in different phases determined by the row-control logic. The row dump patterns [Rst-Dmp(i) and Sig-Dmp(i)] are derived from the Row-Ave(i) pattern. In order to map the row averages to column holding capacitors, the row dump pattern shifts by one bit for every row. This may be implemented by using a shift register that is shifted at the row rate.

Cap-Rst(i) control signals are used to reset the column holding capacitors at the beginning of a block average generation. It shares the same pattern as the Row-Ave(i), except that it is used only once per super-pixel computation.

The rest of the circuit shown in FIG. 16 includes source-follower buffers to differentially read the super-pixel values. The DDS pulse is used for offset-cancellation. In order to allow low-power operation, source follower bias current is turned off in columns that lie outside the user defined ROIs. This is accomplished by using column-decoded PixSF-Enb (i) control signals.

Row Control Logic

Figure 17:
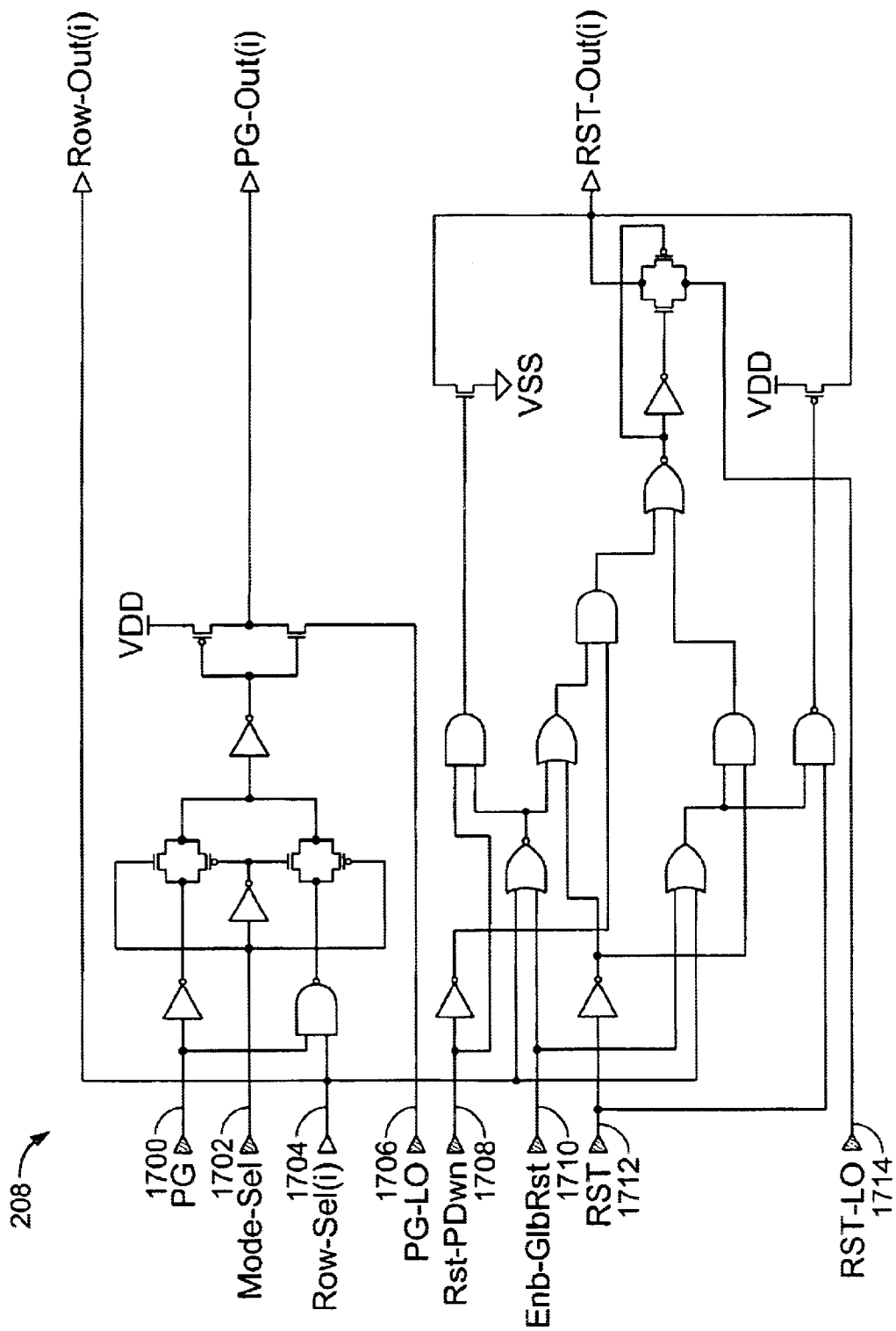
FIG. 17 shows one embodiment of a row control logic.

FIG. 17 shows one embodiment of the row control logic 208. The row control can support both snapshot operation mode and rolling shutter operation mode. In the schematic, PG 1700 is the photogate pulse, Mode-Sel 1702 is the operating mode selection, and Row-Sel 1704 is from row decoder. Rst-PDwn 1708 is the pulse to pull reset gate to 0 V, Enb-GlbRst 1710 is the enable global pulse, and RST 1712 is the reset pulse. PG-LO 1706 and RST-LO 1714 are the d.c. photogate-low and reset-low levels. Mode-Sel=1 sets up the chip in snapshot mode. Rst-PDwn 1708 is required for flushed photogate operation.

On-Chip Counters

There are three different counters in this chip: Super-pixel counter, row counter 218, and column counter 206.

Figure 18:
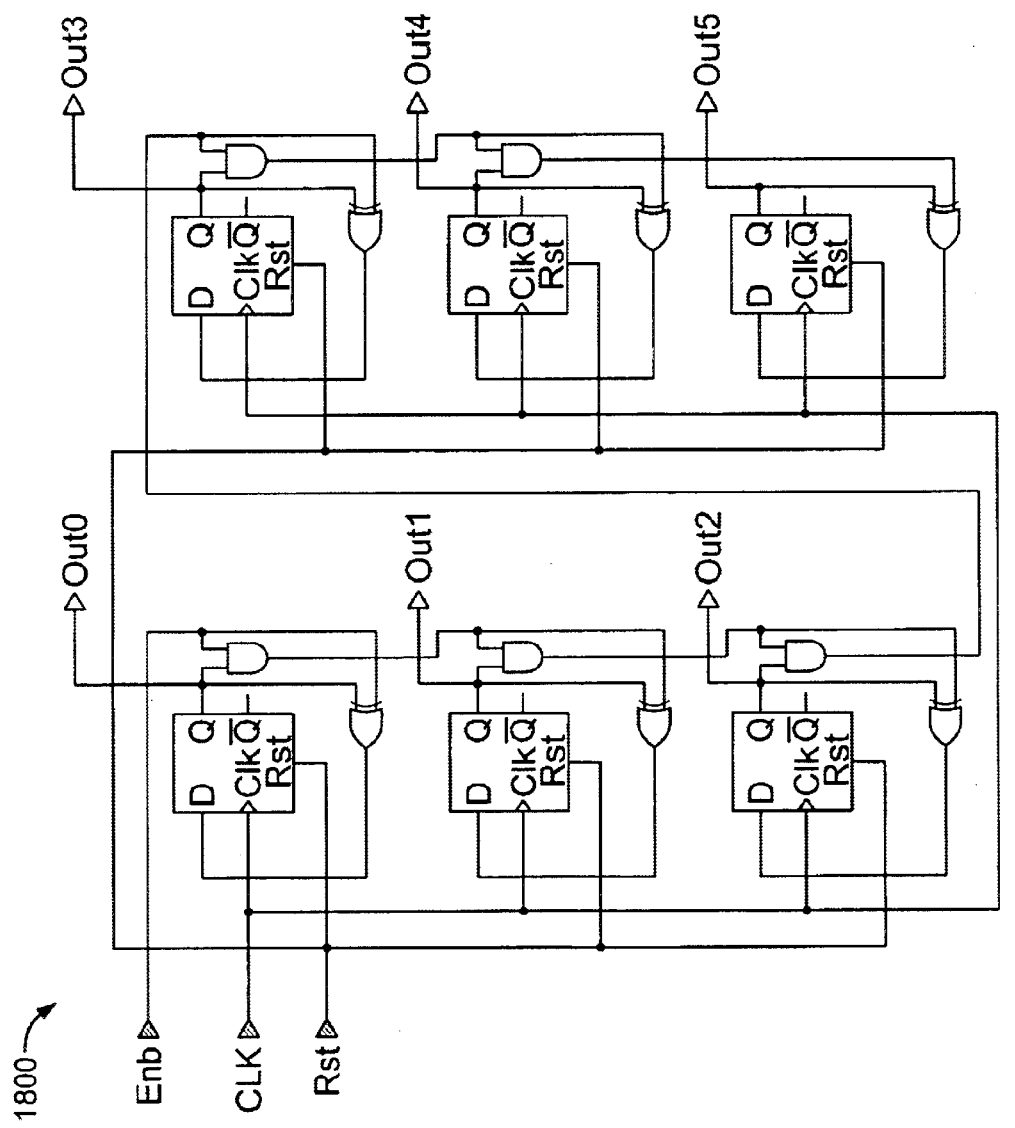
FIG. 18 shows one embodiment of a 6-bit counter.

Super-pixel counter is a 6-bit counter. It is driven by row counter clock. This is used to determine when a super-pixel computation is completed. The one embodiment of the 6-bit counter 1800 is shown in FIG. 18. There are three 6-bit counters 1800 in the chip, one for each window. After the first reset, the counter for window-(i) starts counting up if the current row address is equal to the row start address of window-(i). As the counter output equals the super-pixel size of window(i), it will be reset and counted again. The counter for window-(i) will be deactivated as the row address becomes larger than the row ending address of window-(i).

Figure 19:
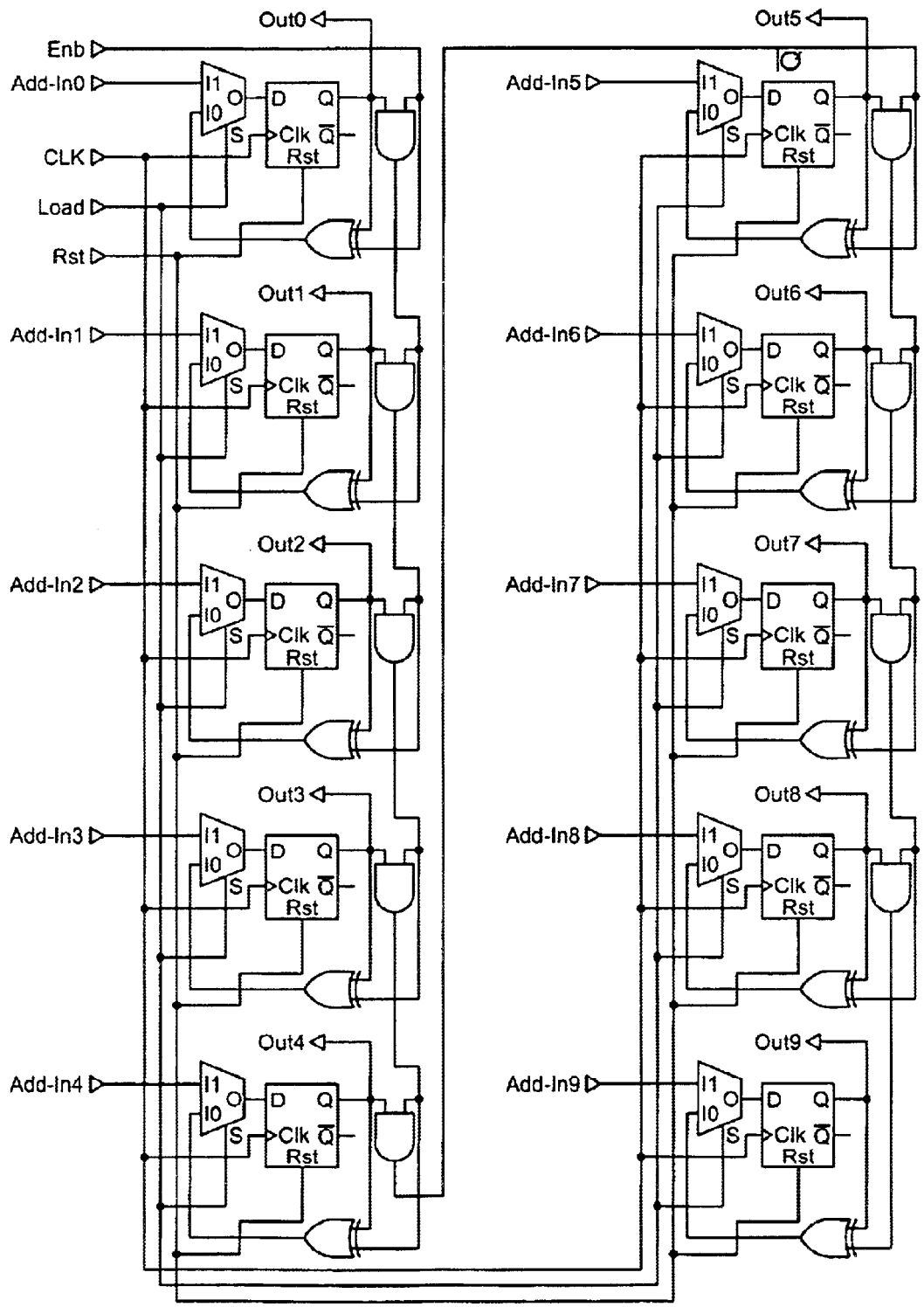
FIG. 19 shows an embodiment of a row counter.

Row counter 218 is a 10-bit UP-counter. However, only the first 8 bits are needed for accessing the 256×256 pixel array. Since the row start addresses of window-1, -2, and -3 may be anywhere in the pixel array, it has the capability to load any of the initial address. FIG. 19 shows an embodiment of the row counter.

Column counter 206 is also a 10-bit UP-counter, with only the first 8 bits used. During readout, the super-pixel value (i.e. the block average) may be available in each column spanned by the super-pixel. However, only one signal needs to be read out per super-pixel. A novel "skip-columns" option may be implemented to enable this option. The "Skip-columns" scheme allows the counter to skip the appropriate number of lower order bits and begin counting from higher order bits. The lower order bits are not altered.

Figure 20:
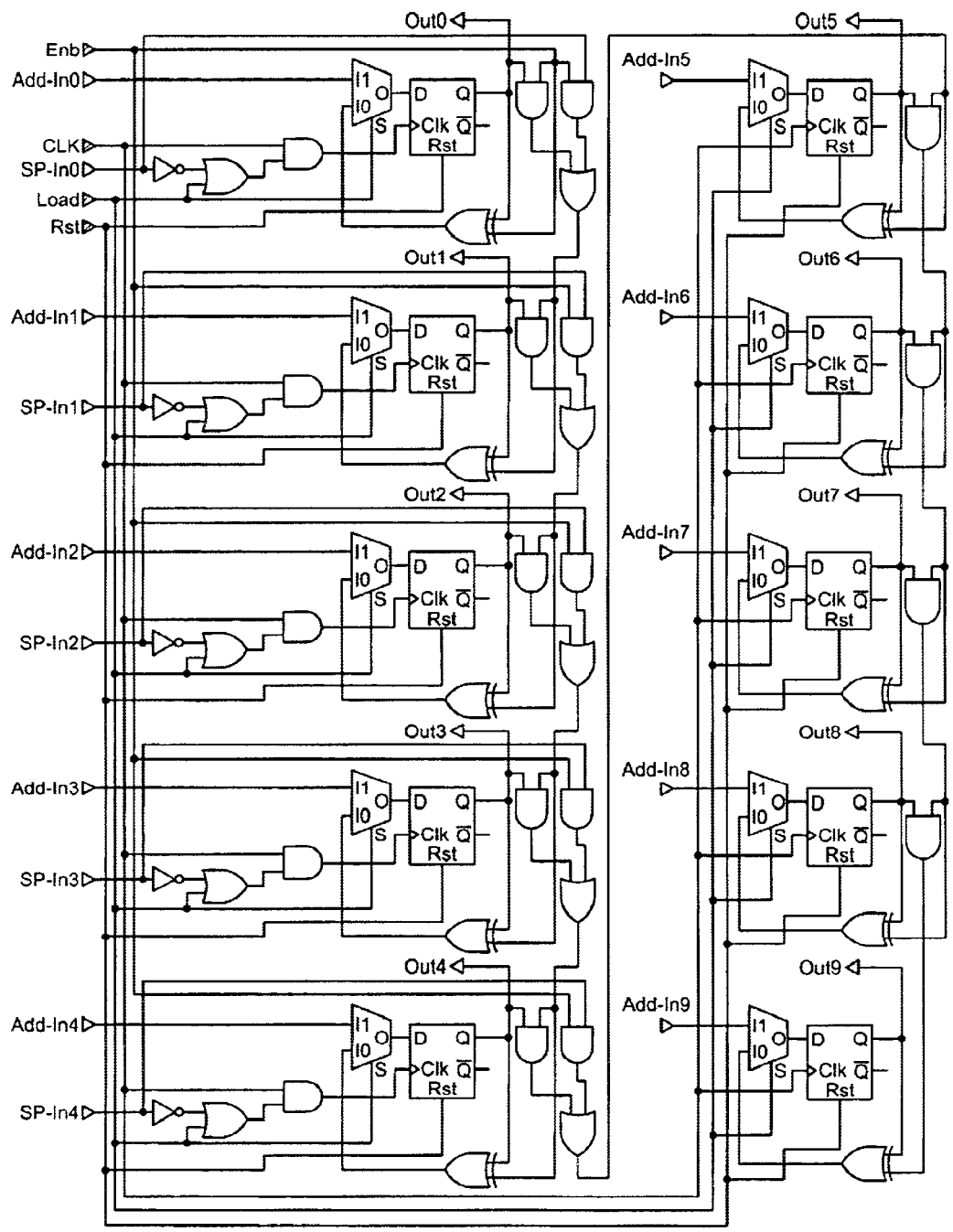
FIG. 20 shows a column counter according to an embodiment.

FIG. 20 shows the column counter 206 according to an embodiment. In the illustrated embodiment, given the window-2 or -3 start address, super-pixel pattern (SP-In1 to SP-In4) generates an enable logic that allows the selection of the bits to skip and the bits for begin-count. For instance, the counter counts up from bit 0 for NDEPTH=1, to bit-1 for NDEPTH=2 and so on, with bit-4 being used to begin count for NDEPTH=32.

Chip I/O Control Logic—Chip Digital Output

Figure 21:
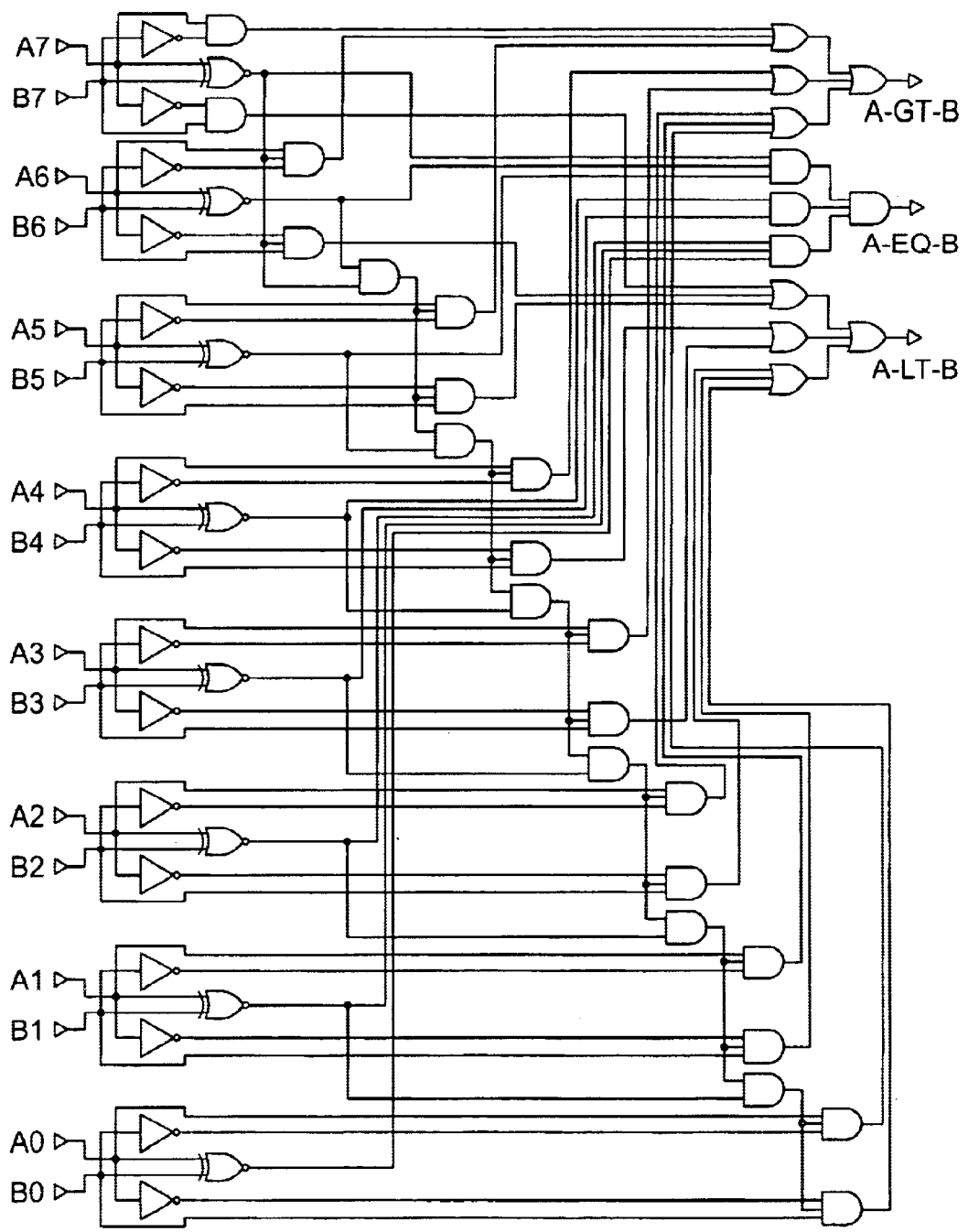
FIG. 21 shows an embodiment of the comparator.

In order to simulate the state-machine design of the foveal vision chip by using the FPGA, the current state information is output from the chip. The necessary state information is contained in six basic digital flags. These six flags are:

Window row operation flag—the window row operation flag is HIGH so long as the current row address is between the row start and end address for a given window. In other words, Window-(i) Row Start Address≦Row Decoder Address≦Window-(i) Row End Address. The address comparison is achieved by using a digital comparator. An embodiment of the comparator is shown in FIG. 21.

Window row operation end flag—the window row operation end flag goes HIGH when the current row decoder address is equal to the window row end address. This flag provides additional information that may be used to determine the end of the window.

Window column operation flag—the window column operation flag is HIGH so long as the current column address is between the column start and end address for a given window. In other words, Window-(i) Column Start Address≦Column Decoder Address≦Window-(i) Column End Address. When this flag is false, the column readout is completed. The control is handed over to the row control.

Window column operation end flag—the window column operation end flag is turned on when the current column decoder address is equal to the window column end address. This flag provides additional information that may be used to determine the restart of row operation.

Window super-pixel expired flag—the window super-pixel expired flag goes HIGH when the output value of super-pixel counter is greater than or equal to the output value of the 3-bit decoder driven by the super-pixel size of the window. This flag is used to stop the row operation, to start the window readout, and to reset the super-pixel counter.

Window super-pixel equal flag—the window super-pixel equal flag provides additional information that may be triggered to stop the row operation and start the column readout operation.

Figure 22:
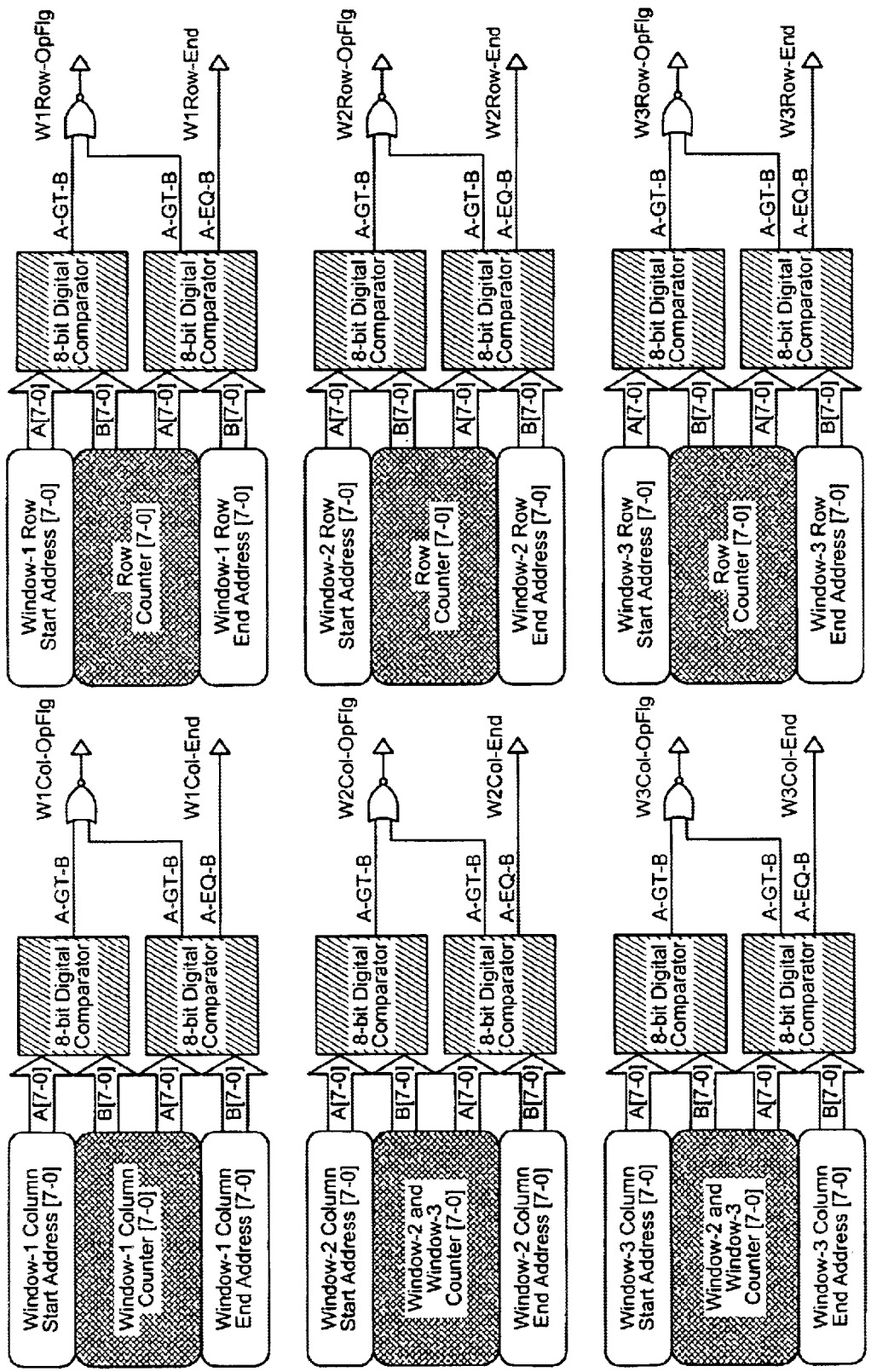
FIG. 22 is a block diagram for generating a window row operation flag, window row operation end flag, window column operation flag, and window column operation end flag for all three windows.

The block diagram for generating the window row operation flag, window row operation end flag, window column operation flag, and window column operation end flag for all three windows is shown in FIG. 22.

Figure 23:
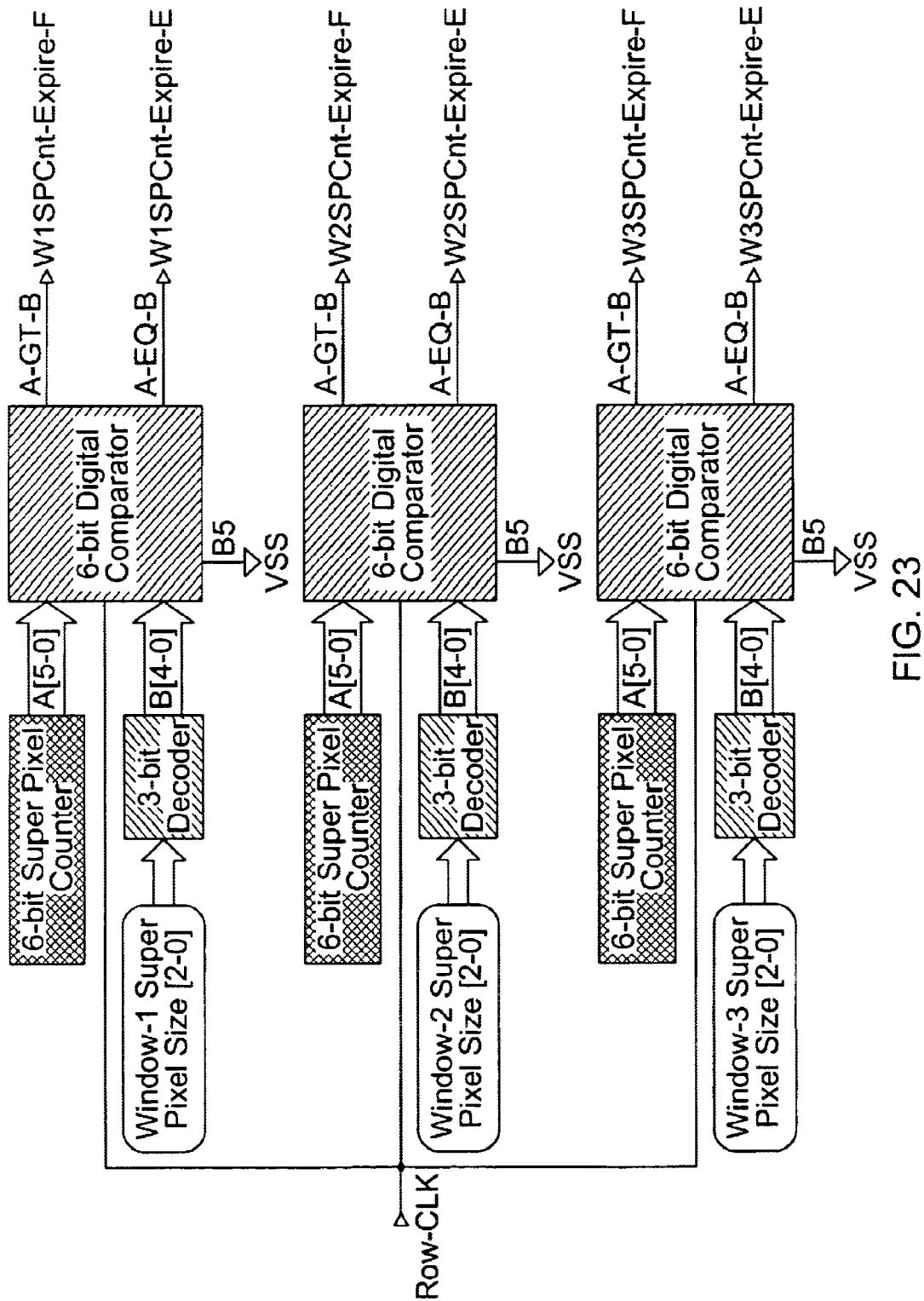
FIG. 23 is a block diagram for generating window super-pixel expired flag and window super-pixel equal flag for the three windows.

The block diagram for generating window super-pixel expired flag and window super-pixel equal flag for the three windows is shown in FIG. 23.

Update Rate and Noise

The re-configurable imager produces image output with high update rates. The high update rates are produced by reduction of data volume to be transferred and integration of timing and control circuits on-chip. This allows short initialization times. ROI resolution modification is carried out using passive capacitor circuits. The modification operates concurrently with the row sampling. Therefore, both power dissipation and temporal overhead associated with on-chip multi-resolution ROI generation may be insignificant portion of the total. For readout of a window including $M_{row}$ and $M_{col}$ of super-pixels, with the size of each super-pixel being $M_{sup}$, the update rate in Hz is given by:

$$F_{update} = \frac{1}{M_{row} * [M_{sup} * t_{row} + t_{blockav} + M_{col} * t_{pix}] + t_{init}},$$

where $t_{init}$ is the super-pixel initialization time, $t_{pix}$ is the time taken to generate the final block-average, and $t_{row}$ is the time required to sample-and-hold pixel values and carry out row-average. For a typical $t_{row}$=1.5 μsec., $t_{blockav}$=1 μsec., and $t_{init}$=5 μsec., update rates in excess of 10 kHz have been achieved for small-sized windows.

Figure 24:
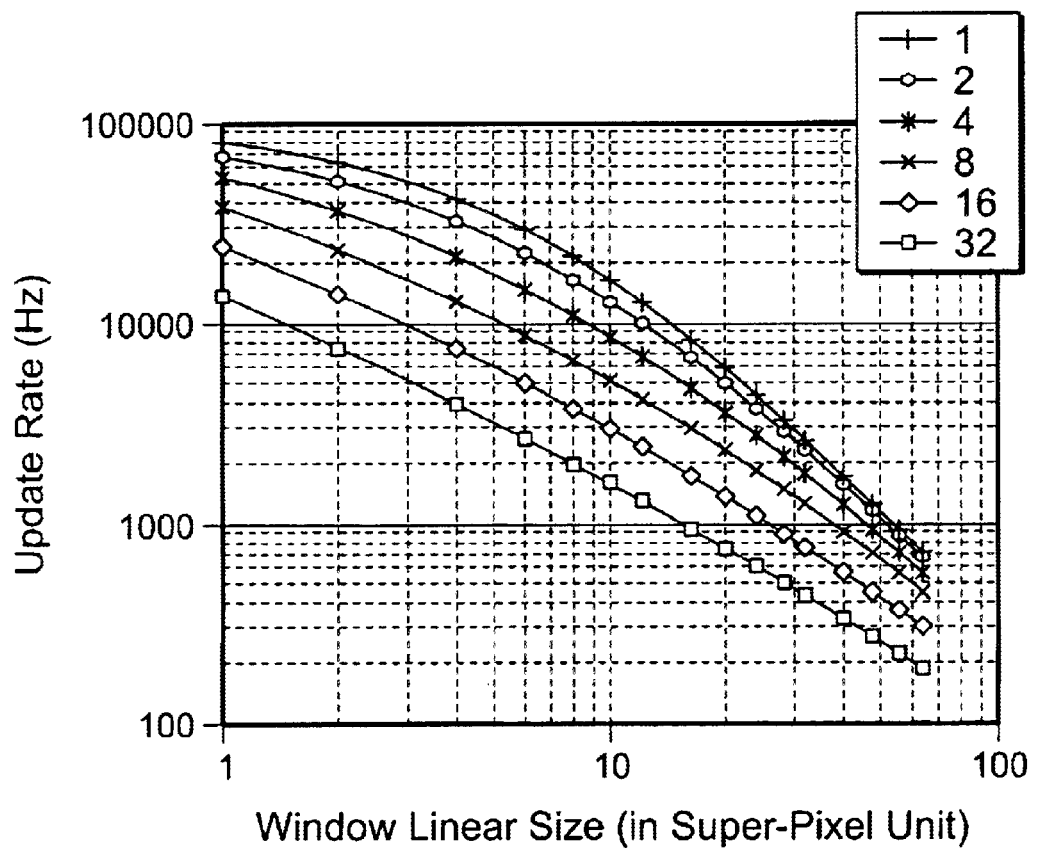
FIG. 24 illustrates projected update rates for different window and super-pixel sizes.

FIG. 24 illustrates the projected update rates for different window and super-pixel sizes. The figure indicates that both for search (small window size, small super-pixel size) and track (large window size, large super-pixel size) modes of imaging, high update rates are possible. The figure also indicates that for the search mode of operation, the update rate is limited by the pixel output rate, whereas for tracking mode it is more dominated by the row processing speeds.

The use of photogate pixels that have built-in correlated double sampling readout provides substantially reduced pixel reset noise. Further, the noise performance may be governed by the source-follower noise sampled and held in the sampling capacitor. This noise is of $kT/C_{SH}$ type and is small—being less than 5 electrons, when appropriately designed. Noise is for single pixel readout, since passive averaging causes a factor of two-signal attenuation. For larger super-pixel sizes, noise may be reduced due to averaging. This may provide a square root of n type signal-to-noise ratio improvement.

Imaging with less than 7-electron read noise has been demonstrated. Since the first source-follower stage determines the imager noise behavior, read noise remains relatively constant, irrespective of the update rate. The consistency of the row sampling rate may also affect the consistency of the read noise.

Imager Performance

A 256×256 CMOS imager with photogate pixels, on-chip variable resolution ROI generation, and control circuits was implemented in 0.5-micron technology. The pixel pitch was 15 μm, limited by the constraints of routing more than 5 wires through the column-control logic. The technology included one layer of poly-silicon and three layers of metal. The pixel size was 15-μm×15-μm with a fill factor of 34.1%. All the control lines in the chip were laid out using metal-1 and metal-2 layers, and all the non-active area in the chip was covered by the light shield formed by metal-3. The limitation on the pixel size comes mainly from the number of column control lines that are needed for controlling multiple windows with variable resolution.

The chip was operated with high update rates. More than 100 Hz operation was achieved at all window sizes and super-pixel resolutions. A very high update rate of 10 kHz was reached for an ROI including 10×10 super-pixels, with each super-pixel including block-averaged 4×4 pixels. Averaging error was measured to be less than 0.05%, for moderately large (about 10 mV) signals. The error reduces for larger mean signals, with the residual error primarily due to switch charge feed-through from the control transistors.

The imager quantum efficiency was measured to be 22%, which is a typical number for a photogate-type device. The imager fixed-pattern-noise (FPN) was not visible, and was measured to be only about 0.1% of the imager saturation levels. Ultra-low noise of less than 7 electrons was measured at 2 MHz data output rates, which is typically the data rate used in the re-configurable imager. The data rate was limited by the data acquisition system limitations. It has been estimated that a 10× improvement in output data rate can be achieved by incorporating ADC on-chip, since digital data output substantially reduces the need for high accuracy settling. The total power dissipation was less than 10 mW including multiple multi-resolution on-demand ROI generation circuits. The digital power dissipation in the column-control logic was measured to be less than 2 mW using a 10 MHz master clock.

Figure 25:
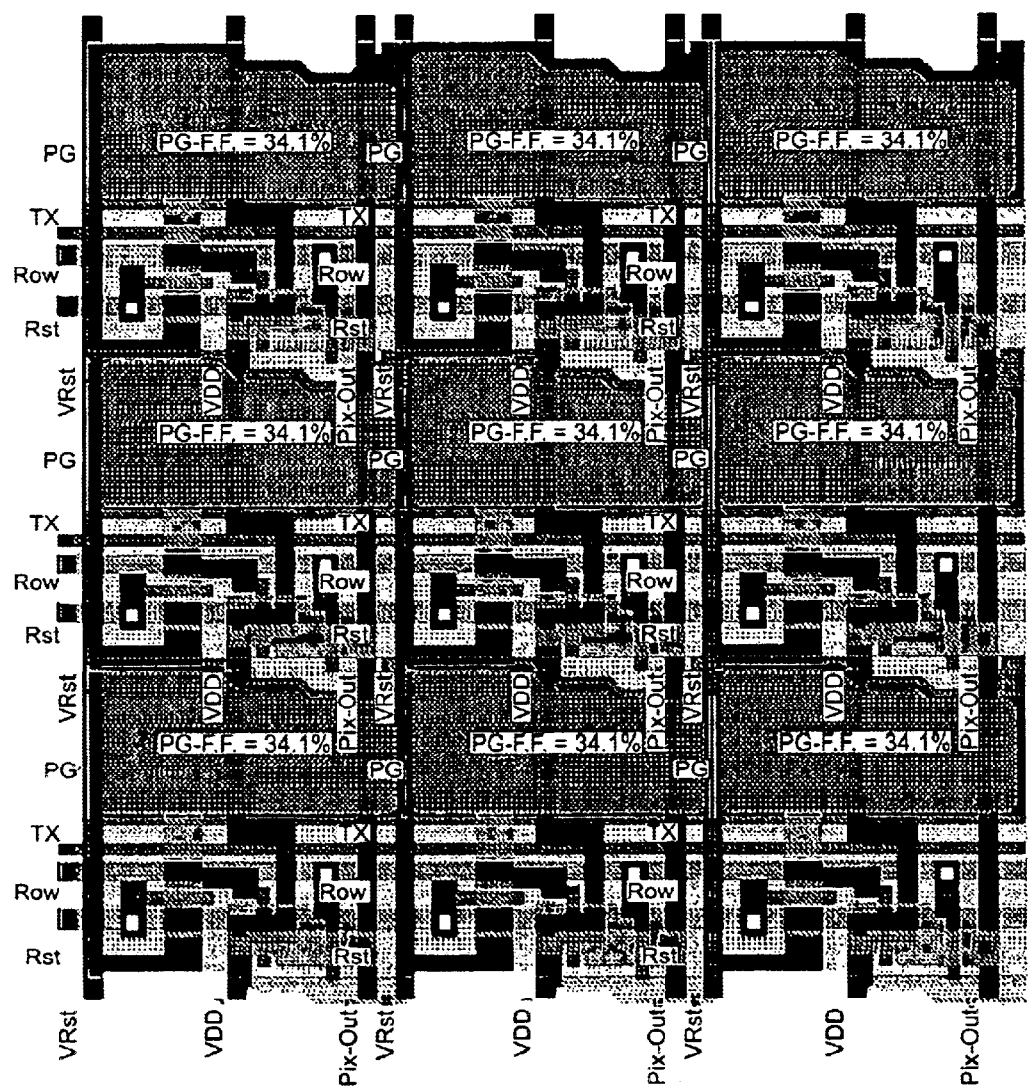
FIG. 25 shows an embodiment of a layout of 3×3 pixel array.

FIG. 25 shows an embodiment of the layout of 3×3 pixel array. The pixel is capable of snapshot mode of operation. In this version, the integration time is constrained to be only equal to or larger than the frame readout time. The chip has 112 I/O bonding pads and the chip size is 6-mm×8-mm, with pixel array occupying approximately 4-mm×4-mm area.

Figure 26:
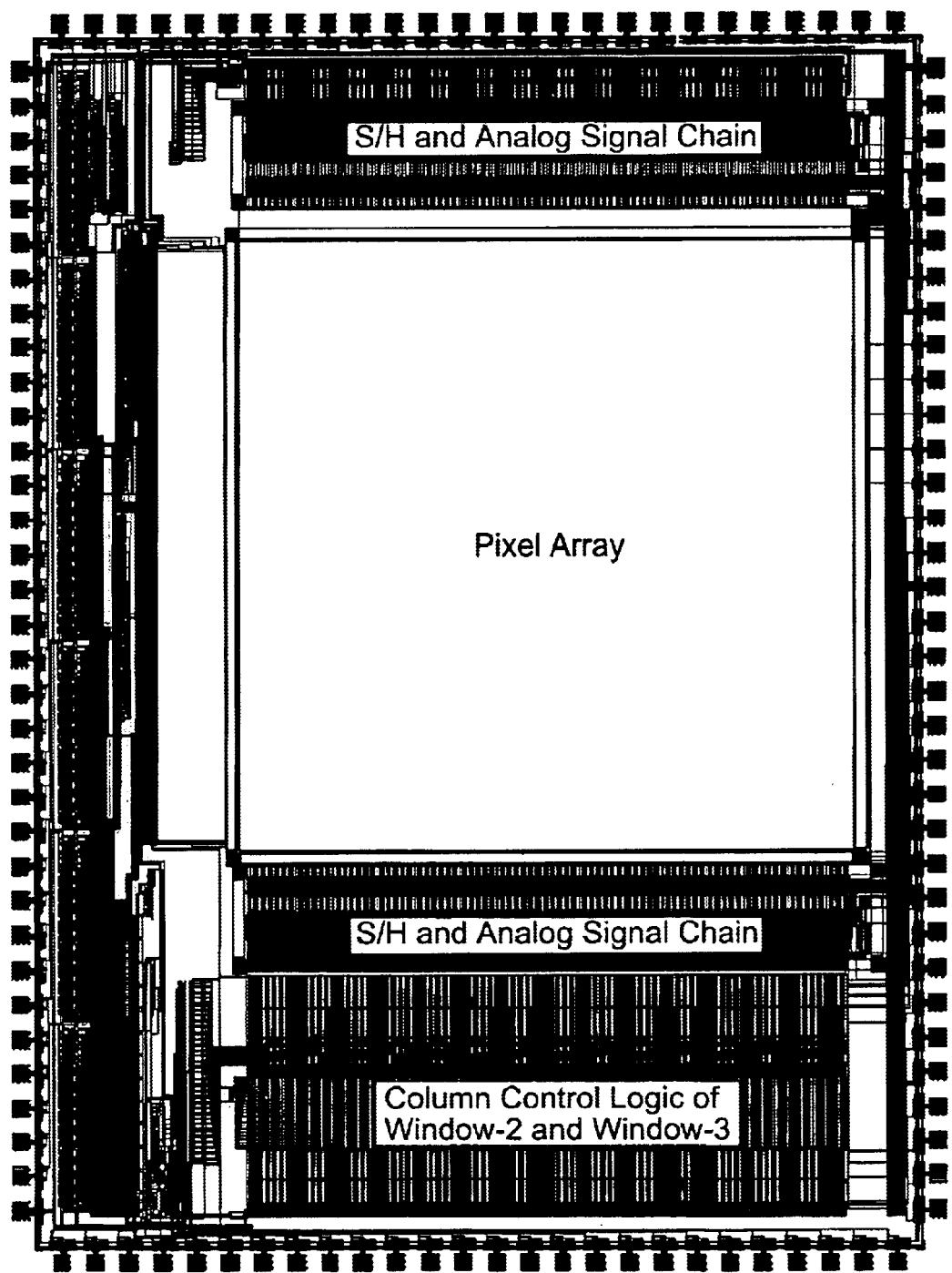
FIG. 26 shows a layout of an on-demand foveal vision APS chip in accordance with an embodiment of the present disclosure.

FIG. 26 shows the layout of the on-demand foveal vision APS chip in accordance with an embodiment of the present disclosure. Table 1 gives the pin-out of the chip that includes the name, location, and a simple description of the pins. R-, L-, T-, and B- stand for right, left, top, and bottom side, respectively. Pad numbers are ordered from top to bottom, and from left to right. Another 8 bond-pads on the chip are used for incorporating test FETs that also serve as a process monitor. The fabricated chip is bonded on a PGA132L package.

Figure 27A:
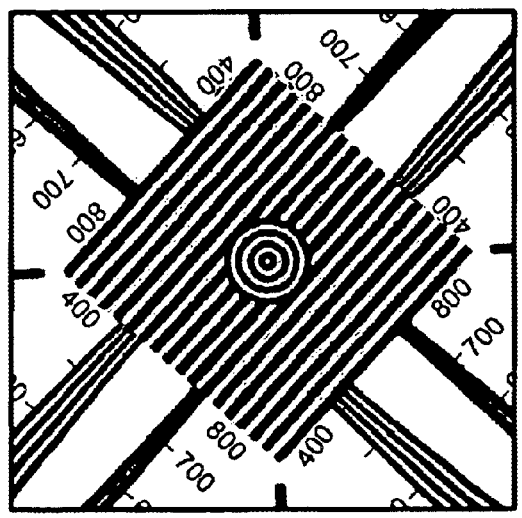
FIG. 27A shows a full-frame bar pattern image captured with a re-configurable imager.
Figure 27B:
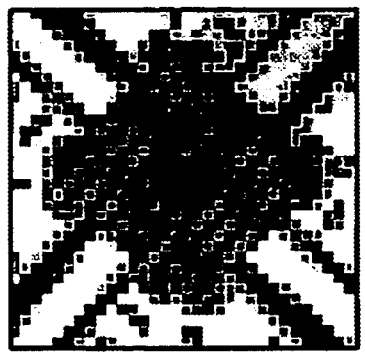
FIG. 27B shows an image captured with 4×lower spatial resolution, where the spatial resolution reduction is carried out using block averaging.
Figure 27C:
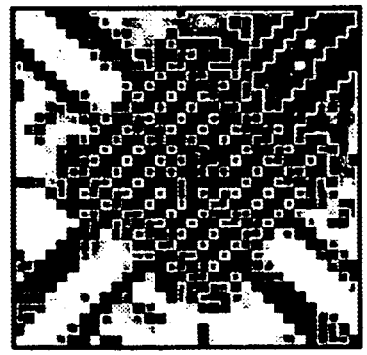
FIG. 27C shows an image captured with 4×lower spatial resolution, where the spatial resolution reduction is carried out using pixel skipping.

FIGS. 27A through 27C show the bar pattern image captured with the re-configurable imager. FIG. 27A shows the full-frame image, while FIGS. 27B and 27C provide images captured with 4× lower spatial resolution. The spatial resolution reduction in FIG. 27B was carried out using block-averaging, whereas that in FIG. 27C was carried out using pixel skipping. Pixel skipping and sub-sampling results in false information generated through aliasing. However, such problems are greatly mitigated in the block averaging approach as shown in FIG. 27B.

An intruder alert system was built using the re-configurable foveal vision system using a simple centroid-tracking algorithm. Initially, the system surveys the full imager FOV at peripheral resolution. The system remains in this state until an intruder first enters the FOV, at which time the ROI position is calculated. The system reconfigures itself such that the next video frame is at peri-foveal (next to highest) resolution and is centered at the ROI. Tracking of the intruder is carried out with the highest resolution 9×9 ROI. At peripheral resolution, the fill camera FOV is covered with only 2.25% as many receptive fields as would be required to cover the same area at maximum resolution. Hence, this provides a potential 50×speed up in the search operation.

Figures 28A, 28B:
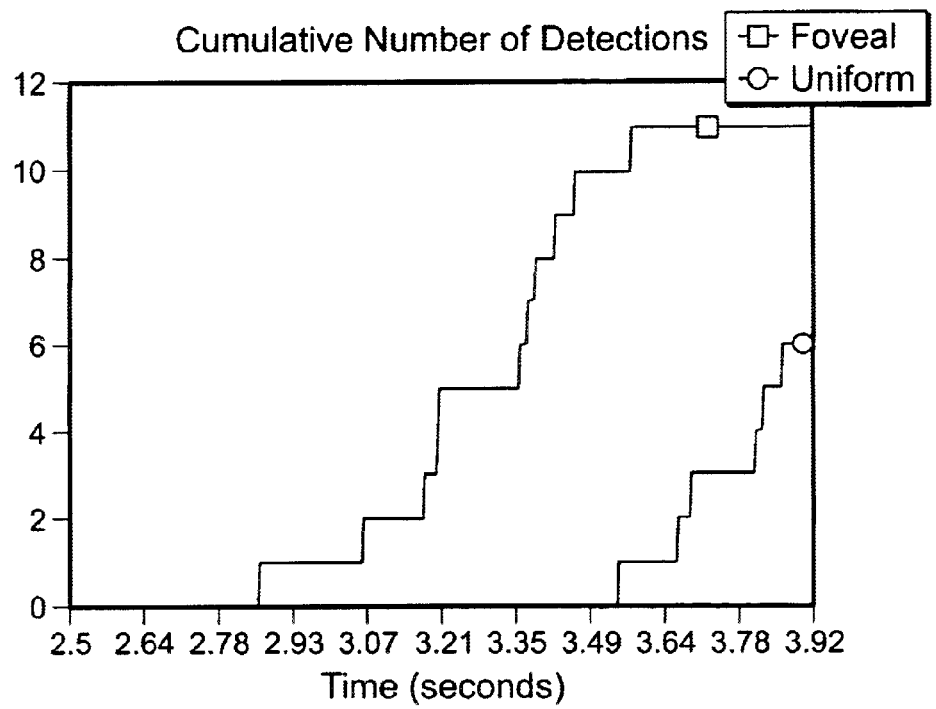
FIG. 28 shows a cumulative number of event detections and its speed for foveal and for uniform acuity imagers.

FIG. 28 demonstrates the power of this simple proof-of-concept on-demand foveal system. The number of targets detected from a wide FOV scene is twice as many from an on-demand re-configurable foveal vision system compared to an active vision system employing uniform acuity. At the same time, the speed with which the targets are detected is also twice that of conventional systems. Thus, the incorporation of on-chip signal processing and on-chip digital control circuits provide performance improvements for search-identify-and-track type applications.

Table 1 summarizes the performance characteristics of the re-configurable imager.

CONCLUSIONS

The design and operation of a large-format re-configurable multi-ROI, multi-resolution CMOS imager is presented. The imager is capable of simultaneously imaging from three separate ROIs with user-selectable resolutions. Update rates in excess of 10 kHz may be reached with less than 7-electron read noise. The total power dissipation, including the control and signal processing circuits is less than 10 mW. Thus, the incorporation of signal processing and control circuits enables high speed imaging with low noise, and low power dissipation. The circuits may concurrently handle the diverse imaging requirements encountered in search, identification and tracking mode of imaging. Therefore, a re-configurable foveal vision system implemented with an integrated CMOS imager is an effective means of achieving wide FOV, high resolution, and fast frame rates. The system may be implemented without increasing payload, on-board processing, while enabling miniature, staring search and track imaging systems operated at low power.

While specific embodiments of the invention have been illustrated and described, other embodiments and variations are possible.

All these are intended to be encompassed by the following claims.

What is claimed is:

1. A vision system, comprising:
   a pixel array having an array of pixels, said array of pixels configured to receive light signals from an image having at least one tracking target;
   at least one multi-resolution window operation circuit configured to process said image, each of said at least one multi-resolution window operation circuits arranged to process at least one tracking target within a particular respective one of a plurality of multi-resolution windows for an image frame, wherein a location of each multi-resolution window and its spatial resolution are programmable independently of the other multi-resolution windows; and
   a pixel averaging circuit configured to sample and average pixels within said particular multi-resolution window.

2. The system of claim 1, further comprising:
   a target detection circuit configured to receive and process said image such that said each of said at least one tracking target is assigned to said particular multi-resolution window.

3. The system of claim 1, wherein said multi-resolution window has a size between 1×1 and 32×32 pixels.

4. The system of claim 1, wherein said pixel averaging circuit includes a plurality of column-parallel capacitors.

5. The system of claim 1, further comprising:
   at least one output analog signal chain, each of said at least one output analog signal chain configured to output signal from said particular multi-resolution window.

6. The system of claim 5, further comprising:
   a plurality of latches, each latch configured to hold definition values of said particular multi-resolution window.

7. The system of claim 1, wherein each of said array pixels includes a poly-silicon gate biased in deep-depletion.

8. The system of claim 1, wherein said pixel averaging circuit includes a super-pixel configuration element that operates to sequentially average the pixels within a super-pixel, where said super-pixel is a group of pixels that is at least 2×2 pixels in size.

9. The system of claim 1, further comprising:
row and column control circuits operating to appropriately arrange said light signal received by said pixel array.

10. A vision system, comprising:
a pixel array having an array of pixels, said array of pixels configured to receive light signals from an image having at least one tracking target;
at least one multi-resolution window operation circuit configured to process said image, each of said at least one multi-resolution window operation circuit arranged to process each of said at least one tracking target within a particular multi-resolution window; and
a pixel averaging circuit configured to sample and average pixels within said particular multi-resolution window,
wherein each of said at least one multi-resolution window operation circuit includes:
a super-pixel average address generation circuit configured to generate addresses of pixels within said super-pixel;
a mask generation circuit operating to provide a mask pattern for averaging pixels;
a switch network configured to input a super-pixel averaging address;
a super-pixel average address and row dump address generation block to provide average address and row dump address to said pixel averaging circuit; and
a capacitor bank control signal generation block configured to generate a control signal for said pixel averaging circuit.

11. The system of claim 10, wherein said switch network includes 32×n switches, where n is a total number of columns.

12. The system of claim 11, wherein said switch network includes a diagonal control connection to ensure that averaging bit pattern is applied column-wise.

13. The system of claim 11, wherein said column control circuit further includes shift registers to shift and align each column of said pixel array to an actual starting address within said particular multi-resolution window.

14. A method for searching and tracking targets, comprising:
receiving light signals from an image having at least one tracking target;
detecting and separating said at least one tracking target into a respective one of a plurality of regions of interest for an image frame, wherein a location of each region of interest and its spatial resolution are programmable independently of the other regions of interest;
grouping each of said at least one region of interest into a plurality of blocks; and
first averaging pixels within each of said plurality of blocks.

15. The method of claim 14, where said first averaging includes sequentially averaging the pixels within a super-pixel, where said super-pixel is a group of pixels that is at least 2×2 pixels in size.

16. The method of claim 14, wherein said first averaging is carried out in a passive capacitor array organized in column-parallel fashion.

17. The method of claim 14, wherein said first averaging includes block-averaging, said block-averaging including:
second averaging of a given row of pixel values;
storing an averaged value;
repeating said second averaging and storing for all rows, said repeating generating a plurality of row averages; and
computing an average of said plurality of row averages.

18. The method of claim 17, wherein said computing includes switching sample and hold capacitor in each column.

* * * * *